(12) United States Patent
Masuda et al.

(10) Patent No.: US 11,495,405 B2
(45) Date of Patent: Nov. 8, 2022

(54) ELECTRONIC DEVICE

(71) Applicant: TDK Corporation, Tokyo (JP)

(72) Inventors: Akihiro Masuda, Tokyo (JP); Norihisa Ando, Tokyo (JP); Shinya Ito, Tokyo (JP); Kosuke Yazawa, Tokyo (JP); Yoshiki Satou, Tokyo (JP); Katsumi Kobayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/816,856

(22) Filed: Mar. 12, 2020

(65) Prior Publication Data

US 2020/0294719 A1 Sep. 17, 2020

(30) Foreign Application Priority Data

Mar. 15, 2019 (JP) .............................. JP2019-049018

(51) Int. Cl.
*H01G 2/06* (2006.01)
*H01G 4/005* (2006.01)
*H01G 4/12* (2006.01)
*H01G 4/228* (2006.01)
*H01G 4/30* (2006.01)

(52) U.S. Cl.
CPC ............ *H01G 4/228* (2013.01); *H01G 2/065* (2013.01); *H01G 4/005* (2013.01); *H01G 4/12* (2013.01); *H01G 4/30* (2013.01)

(58) Field of Classification Search
CPC ............ H01G 2/065; H01G 2/06; H01G 2/02; H01G 2/04; H01G 2/10; H01G 4/005; H01G 4/12; H01G 4/224; H01G 4/228; H01G 4/232; H01G 4/248; H01G 4/30; H01G 4/38; H01G 4/40; H01G 11/10; H01G 11/82; H05K 3/301; Y02E 60/13; Y10T 29/43
USPC ............ 361/301.1, 500, 305, 301.4; 174/260
See application file for complete search history.

(56) References Cited

U.S. PATENT DOCUMENTS

| | | | | |
|---|---|---|---|---|
| 3,851,936 A | * | 12/1974 | Muller | F16B 12/20 206/499 |
| 4,600,968 A | * | 7/1986 | Sekiya | H01L 25/115 257/697 |
| 2013/0141850 A1 | * | 6/2013 | Honda | H01G 4/38 361/679.01 |
| 2014/0328008 A1 | | 11/2014 | Honda et al. | |
| 2018/0182553 A1 | * | 6/2018 | Yazawa | H01G 4/12 |

FOREIGN PATENT DOCUMENTS

| | | | | |
|---|---|---|---|---|
| CN | 103988272 A | | 8/2014 | |
| JP | S59-14329 U | | 1/1984 | |
| JP | 2011-040684 A | | 2/2011 | |
| JP | 2014135329 A | * | 7/2014 | H01G 2/10 |
| JP | 2020-098834 A | | 6/2020 | |

\* cited by examiner

*Primary Examiner* — Timothy J Thompson
*Assistant Examiner* — Guillermo J Egoavil
(74) *Attorney, Agent, or Firm* — Oliff PLC

(57) ABSTRACT

An electronic component has capacitor chips where terminal electrodes are formed on both end surfaces, individual metal terminals connected to the terminal electrodes, an insulation case accommodating the capacitor chips, and a connecting portion interconnecting a plurality of the insulation cases.

23 Claims, 29 Drawing Sheets

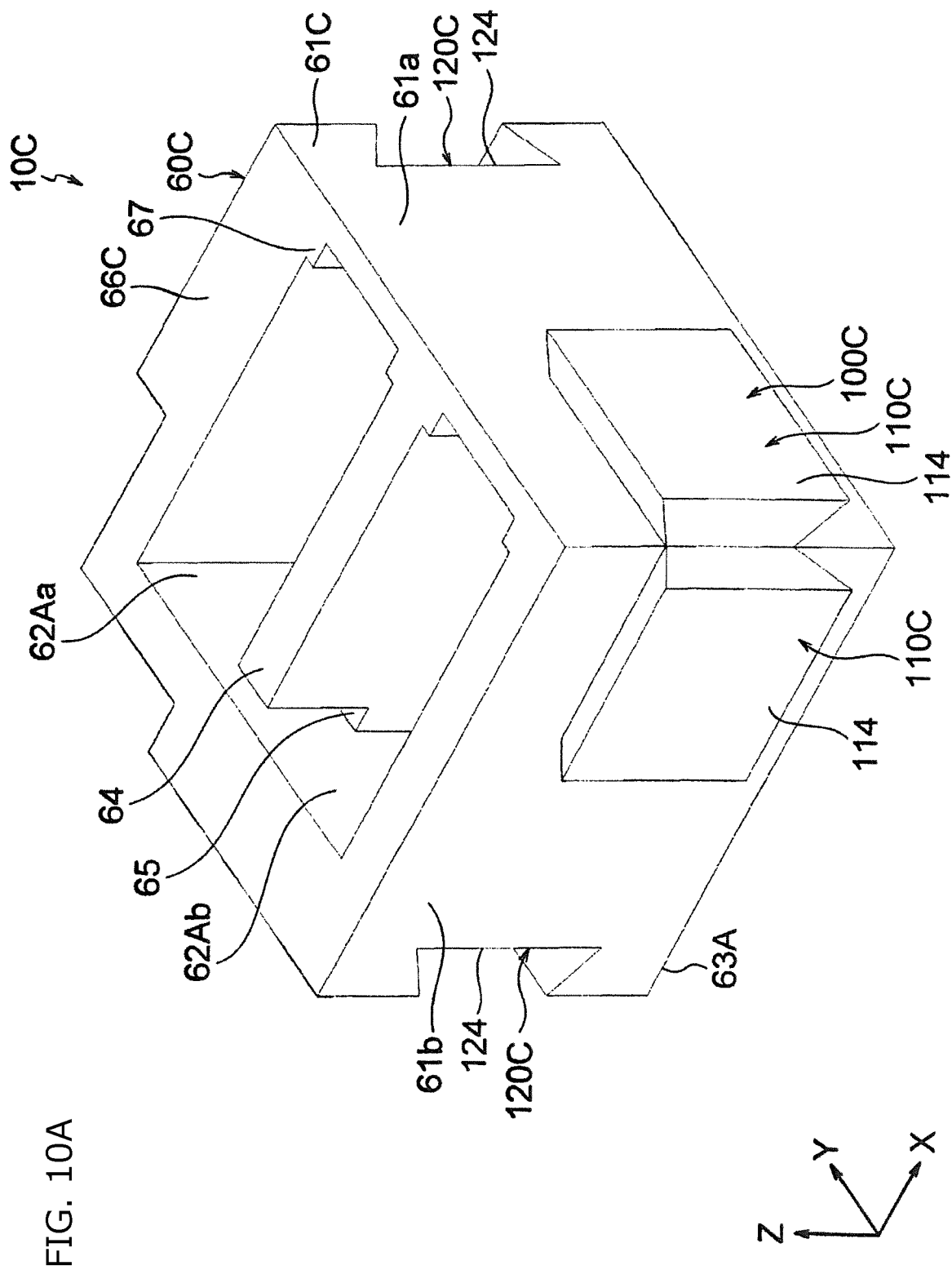

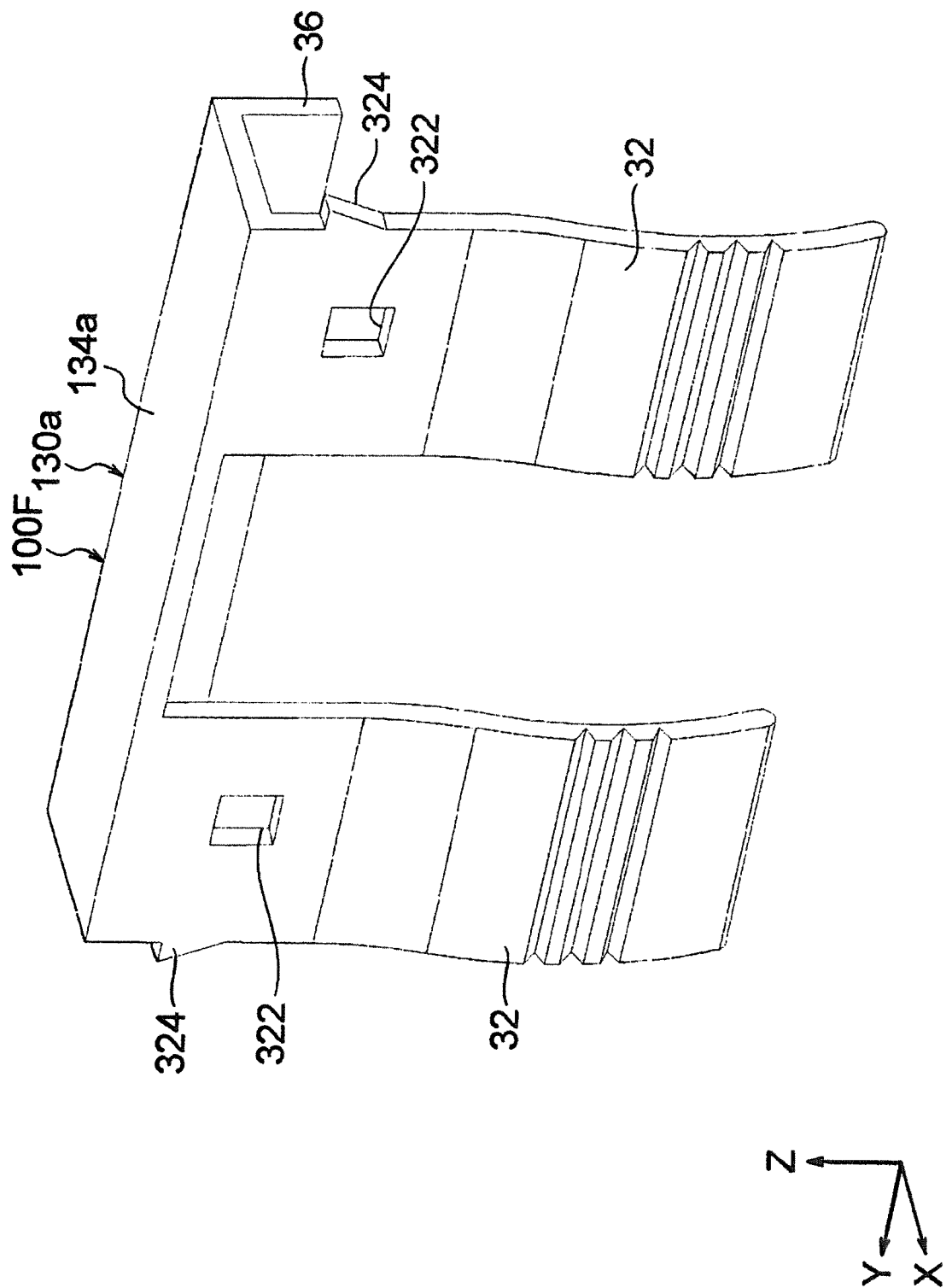

ELECTRONIC DEVICE

BACKGROUND OF THE INVENTION

1. Field of the Invention

The present invention relates to an electronic device having a case accommodating a chip component such as a multilayer ceramic capacitor.

2. Description of the Related Art

Known as an electronic device such as a multilayer ceramic capacitor is a general electronic device in which a chip component is, for example, directly surface-mounted on a substrate or the like by itself. As disclosed in JP 2011-040684 A and so on, an electronic device in which a chip component is accommodated in a case (housing) is also known as an electronic device such as a multilayer ceramic capacitor.

It has been reported that this type of electronic device has an effect of protecting the chip component from an impact or the like after the mounting. This type of electronic device is used in fields where durability, reliability, and the like are required.

The electronic devices according to the related art are configured by case in many cases. Accordingly, the electronic devices are not always convenient for users in a case where it is desired to handle a plurality of the electronic devices as a single unit.

SUMMARY OF THE INVENTION

The invention has been made in view of such circumstances, and an object of the invention is to provide a user-friendly electronic device.

In order to achieve the above object, an electronic device according to the invention includes a chip component having a terminal electrode formed on an end surface;

a conductive terminal connected to the terminal electrode;

a case accommodating the chip component; and a connecting portion interconnecting the case to the other case.

The connecting portion interconnecting the case to the other case. Accordingly, a body in which a plurality of the electronic devices are joined can be configured by the interconnection of the plurality of cases via the connecting portion. Accordingly, a user can handle the plurality of electronic devices as a single unit. In addition, the user can optimize the configuration into a user-friendly form through arrangement such as increasing or decreasing the number of connections of the cases by site of use.

The connecting portion comprises a first engagement portion or a second engagement portion engageable with the first engagement portion of the other case. The first engagement portion and the second engagement portion are formed on outer side surface of the case. With this configuration, it is possible to interconnect the plurality of cases via the first engagement portion and the second engagement portion provided on each of the cases without separately preparing the connecting portion.

The first engagement portion and the second engagement portion have hook shapes allowing mutual engagement. With this configuration, it is possible to interconnect the cases by meshing (or hooking) between the first engagement portion formed on one case and the second engagement portion formed on the other case.

Preferably, a pair of first engagement portions are formed on the outer side surface on one side of the case, a pair of second engagement portions are formed on the outer side surface on the other side of the case, the pair of first engagement portions are bent toward each other, and the pair of second engagement portions are bent away from each other. With this configuration, the first and second engagement portions bent in the opposite directions are alternately meshed (or hooked) during the engagement between the pair of first engagement portions formed on one case and the pair of second engagement portions formed on the other case. Accordingly, the cases can be firmly interconnected.

A projection protruding outward from the case may form the first engagement portion and a recess recessed toward an inner side of the case may form the second engagement portion. With this configuration, it is possible to easily interconnect the cases by engaging the projection formed on one case and the recess formed in the other case with each other.

Each of the projection and the recess may have a trapezoidal cross-sectional shape. With this configuration, the projection is unlikely to escape from the recess and the connection strength between the cases can be increased when the projection formed on one case and the recess formed in the other case are engaged with each other.

Preferably, the projection becomes wide along a height direction of the case in a protrusion direction of the projection and the recess becomes wide along the height direction of the case in a direction opposite to the protrusion direction. With this configuration, the projection is unlikely to escape from the recess in the protrusion direction.

Preferably, the recess extends substantially horizontally along the outer side surface of the case from a corner portion of the case. With this configuration, the engagement between the first engagement portion and the second engagement portion in each case is unlikely to be released even when an external force along the height direction is applied to the case.

The projection may become wide along a width direction perpendicular to a height direction of the case in a protrusion direction of the projection and the recess may become wide along the width direction of the case in a direction opposite to the protrusion direction. With this configuration, the projection is unlikely to escape from the recess in the protrusion direction.

Preferably, the recess extends substantially vertically along the outer side surface of the case from a corner portion of the case. With this configuration, the engagement between the first engagement portion and the second engagement portion in each case is unlikely to be released even when an external force along the width direction is applied to the case.

Each of the projection and the recess may has a cross shape. With this configuration, the engagement between the first engagement portion and the second engagement portion in each case is unlikely to be released even when an external force along the height or width direction is applied to the case.

A first projection protruding outward from the case forms the first engagement portion, an assemblage of a second projections protruding outward from the case forms the second engagement portion, and the first projection is sandwiched by the assemblage of the discretely disposed second projections of the other case. With this configuration, it is possible to interconnect the cases by engaging the first projection formed on one case and the assemblage of the second projections formed on the other case with each other.

The connecting portion may be formed separately from the case. With this configuration, the case is not provided with the connecting portion, and thus the configuration of the case can be simplified.

Preferably, the connecting portion also serves as the conductive terminal and interconnects the terminal electrode of the chip component accommodated in the case with a terminal electrode of a other chip component accommodated in the other case. With this configuration, it is possible to interconnect the cases via the connecting portion and the chip components accommodated in the cases can be easily connected in series or in parallel.

Preferably, the connecting portion has inside electrode portions connected to the terminal electrode of the chip component accommodated in the case and a electrode connection portion interconnecting the inside electrode portions. With this configuration, the chip components can be electrically interconnected via the respective inside electrode portions and the electrode connection portion.

BRIEF DESCRIPTION OF THE DRAWINGS

FIG. 3 is a cross-sectional view of the electronic device taken along line III-III in

FIG. 1;

FIG. 10A is a schematic perspective view of a case of an electronic device according to a fourth embodiment of the invention;

FIG. 17 is a schematic perspective view of a metal terminal illustrated in FIG. 16A.

DETAILED DESCRIPTION OF THE PREFERRED EMBODIMENTS

Figure 1:
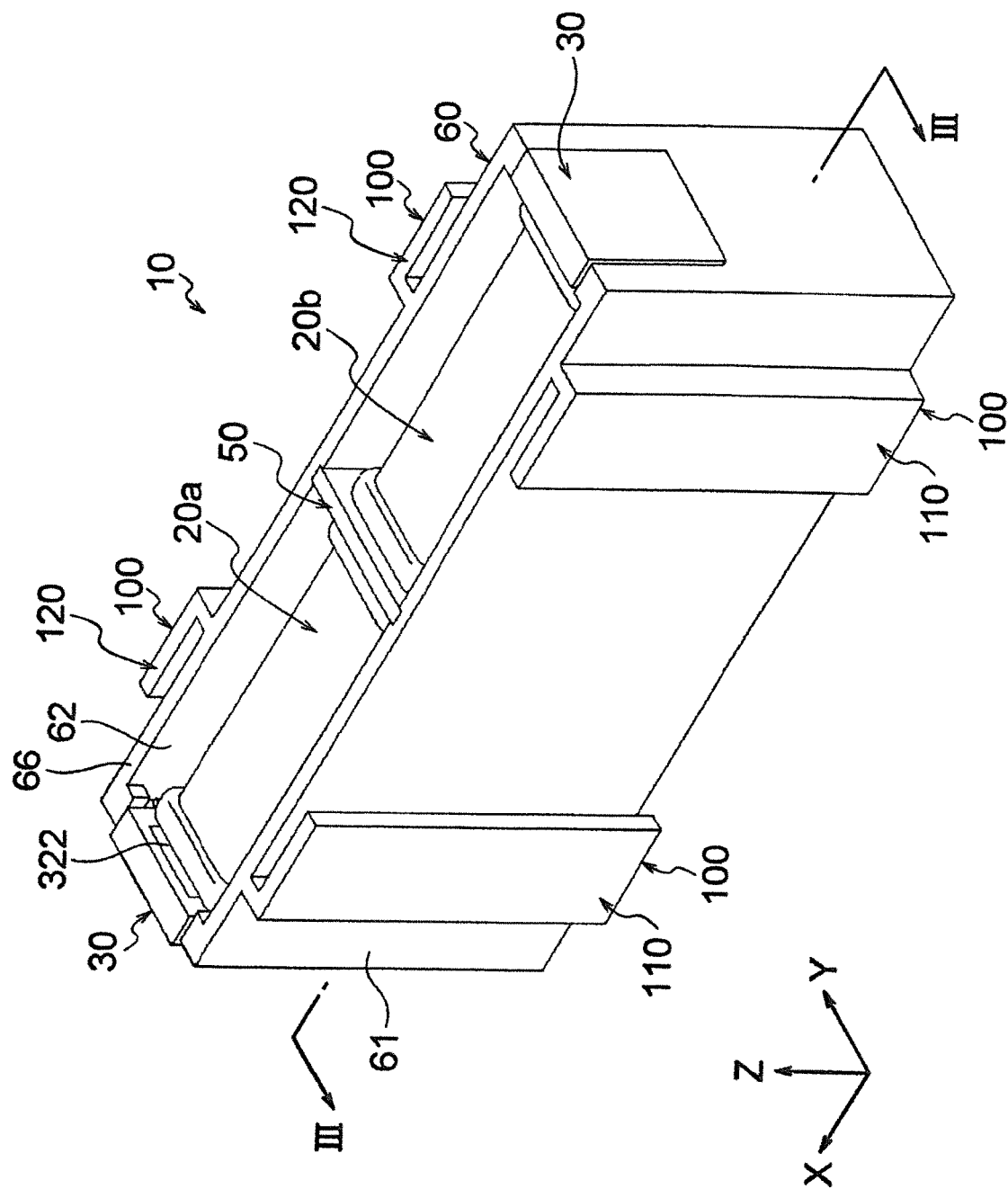
FIG. 1 is a schematic perspective view of an electronic device according to a first embodiment of the invention.

Hereinafter, the invention will be described based on embodiments illustrated in the drawings.

First Embodiment

As illustrated in FIG. 1, an electronic device 10 according to a first embodiment of the invention has two capacitor chips (chip components) 20a and 20b, a pair of individual metal terminals 30 and 30, an intermediate connector 50, and an insulation case 60.

Figure 2A:
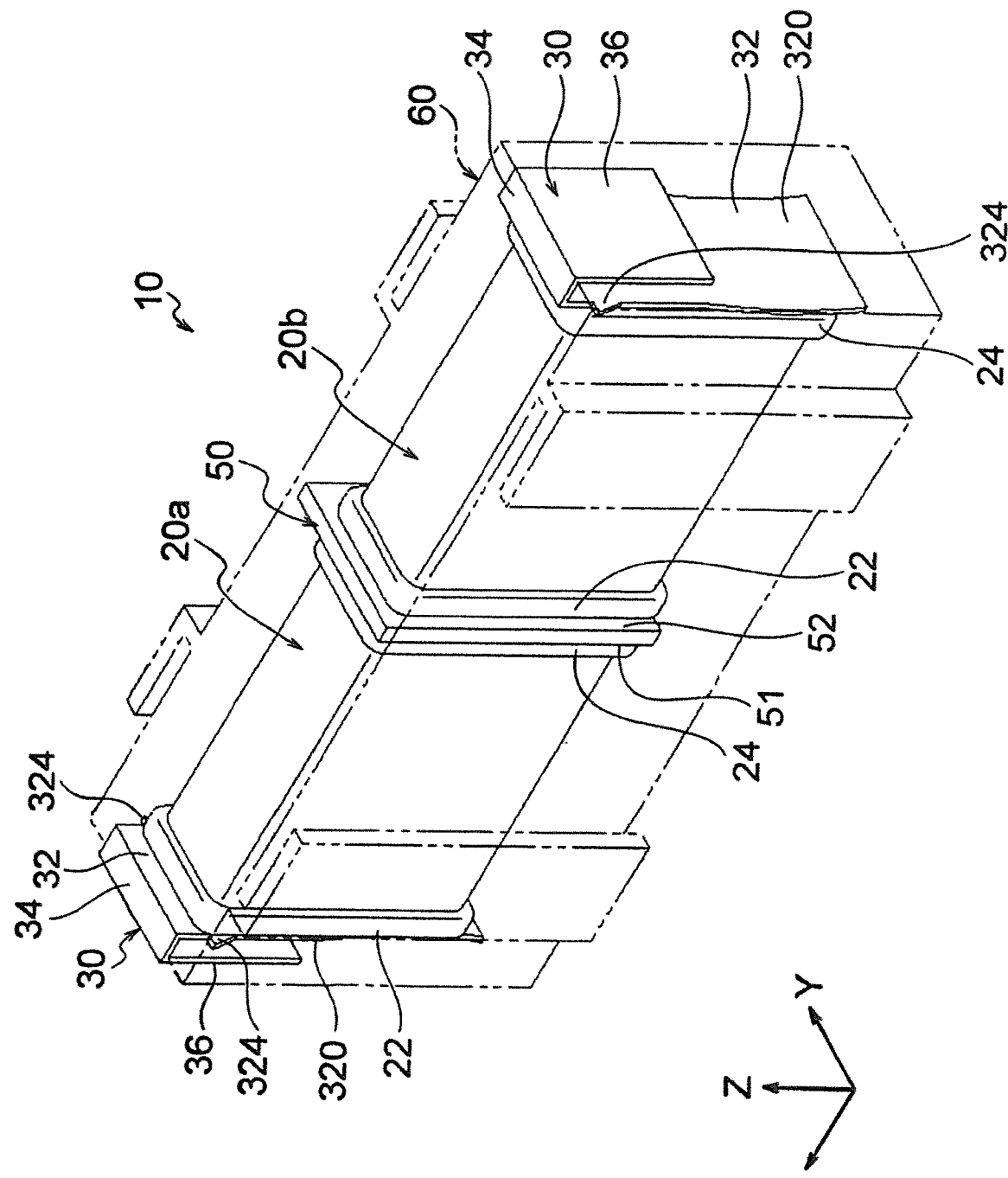
FIG. 2A is a schematic perspective view of the electronic device illustrating the inner portion of a case illustrated in FIG. 1 with the case transparent.
Figure 3:
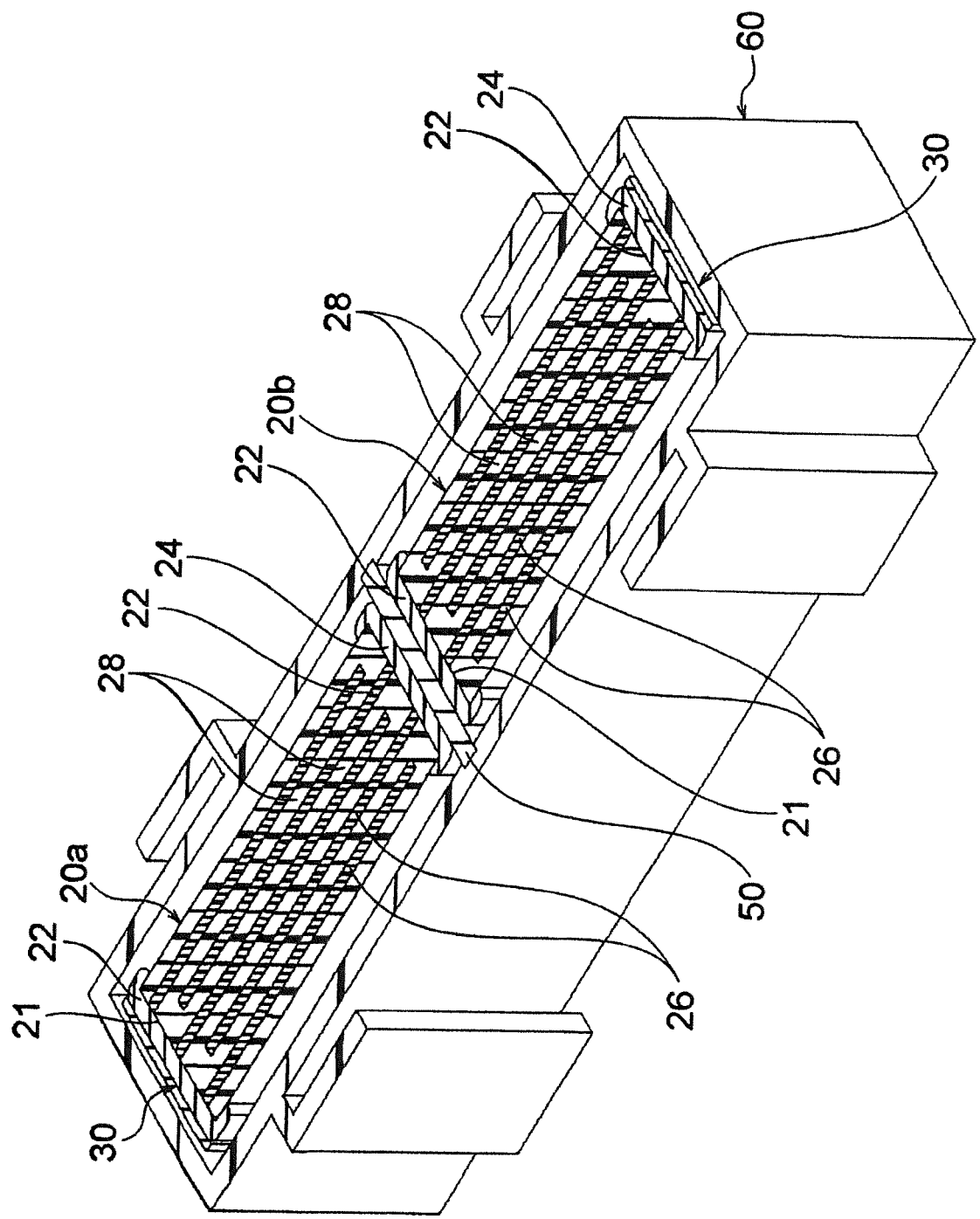

As illustrated in FIG. 2A, each of the capacitor chips 20a and 20b has a substantially rectangular parallelepiped shape and the capacitor chips 20a and 20b have substantially the same shape and size. As illustrated in FIG. 3, each of the capacitor chips 20a and 20b has an element main body in which inner electrode layers 26 and dielectric layers 28 are stacked along a Y-axis direction. A first terminal electrode 22 and a second terminal electrode 24 are respectively formed on a first end surface 21 and a second end surface 23 of the element main body, which face each other in an X-axis direction (longitudinal direction), and are connected to any of the inner electrode layers 26 adjacent in the stacking direction.

The material of the dielectric layers 28 in the capacitor chips 20a and 20b is not particularly limited. For example, the material is a dielectric material such as calcium titanate, strontium titanate, barium titanate, and a mixture thereof. The thickness of each dielectric layer 28 is not particularly limited. In general, the thickness is one micrometer to several hundred micrometers. In the present embodiment, the thickness of each dielectric layer 28 is preferably 1.0 to 5.0 μm.

Although the conductor material that is contained in the inner electrode layer 26 is not particularly limited, a relatively inexpensive base metal can be used in a case where the material that constitutes the dielectric layer 28 has reduction resistance. Ni or a Ni alloy is preferable as the base metal. Preferable as the Ni alloy is an alloy of Ni and one or more elements selected from Mn, Cr, Co, and Al. The Ni content of the alloy is preferably 95% by weight or more. The Ni or the Ni alloy may contain approximately 0.1% by weight or less of various trace components such as P. In addition, the inner electrode layer 26 may be formed by means of commercially available electrode paste. The thickness of the inner electrode layer 26 may be appropriately determined depending on the application or the like.

The material of the first terminal electrode 22 and the second terminal electrode 24 is not particularly limited. Although copper, a copper alloy, nickel, a nickel alloy, or the like is usually used as the material, silver, an alloy of silver and palladium, or the like can also be used. The thickness of the terminal electrodes 22 and 24 is not particularly limited. Usually, the thickness is approximately 10 to 50 µm. At least one type of metal coating selected from Ni, Cu, Sn, and the like may be formed on the surfaces of the first terminal electrode 22 and the second terminal electrode 24.

The shape and size of the capacitor chips 20a and 20b may be appropriately determined depending on the purpose and application. For example, the capacitor chips 20a and 20b have a length (X-axis dimension illustrated in FIG. 2A) of approximately 1.0 to 6.5 mm, a width (Z-axis dimension illustrated in FIG. 2A) of approximately 0.5 to 5.5 mm, and a thickness (Z-axis dimension illustrated in FIG. 2A) of approximately 0.3 to 3.5 mm. A plurality of the capacitor chips 20a and 20b may have different sizes and shapes. The X, Y, and Z axes in the drawings are mutually perpendicular.

Figure 2B:
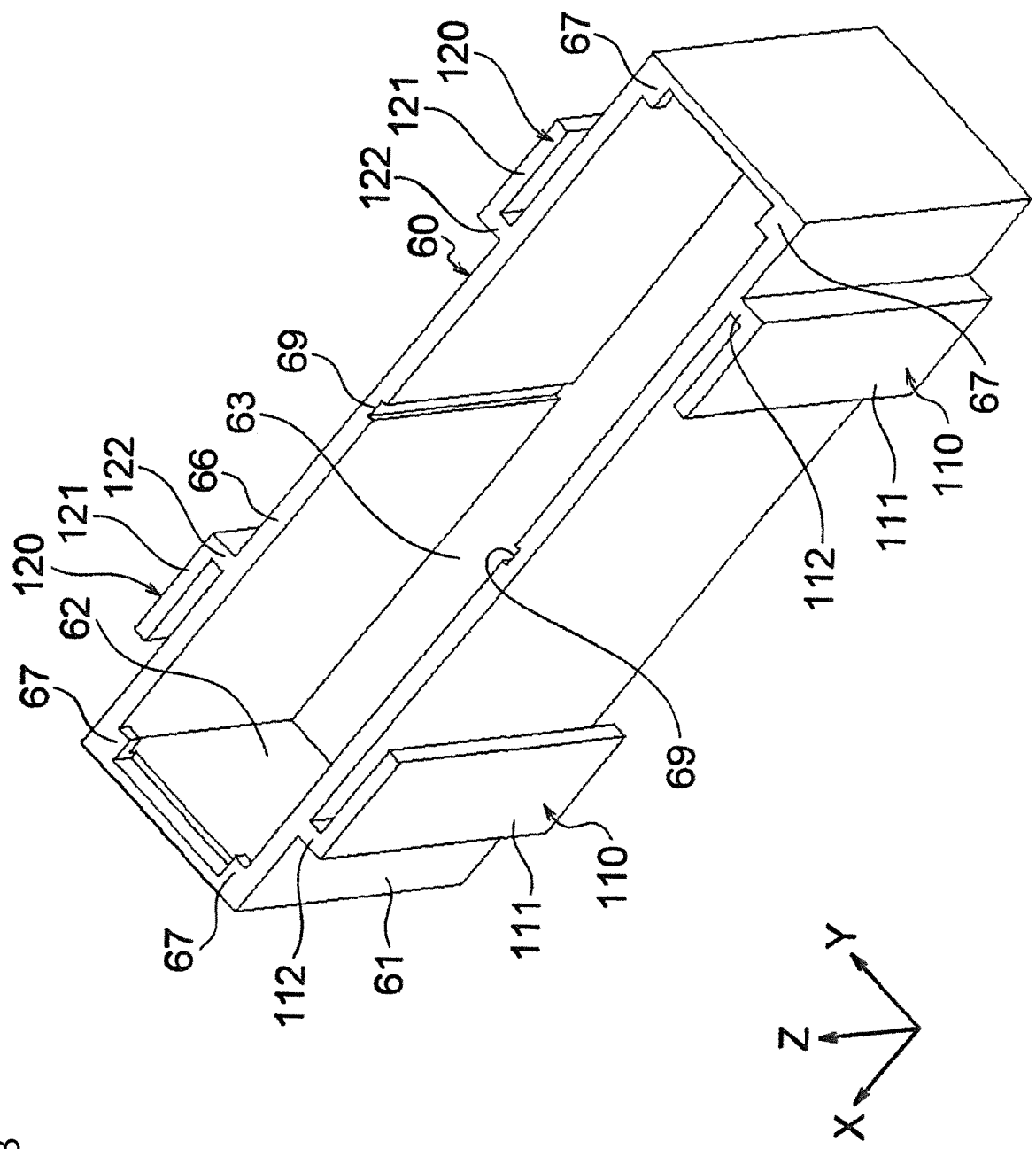
FIG. 2B is a schematic perspective view of the case illustrated in FIG. 1.

As illustrated in FIG. 2B, a rectangular parallelepiped housing elongated in the X-axis direction constitutes the insulation case 60. The insulation case 60 has an outer wall 61 and a bottom wall 63, which surround an accommodation recess 62 opening upward in the Z axis.

The opening surface of the accommodation recess 62 of the insulation case 60 is formed only on the upper surface in the Z-axis direction. The outer wall 61 and the bottom wall 63 do not have any holes, notches, grooves, or openings communicating with the outside of the insulation case 60. As for the insulation case 60, an opening edge surface 66 is provided along the opening surface of the accommodation recess 62 and on the upper surface of the outer wall 61 in the Z-axis direction. Although the opening edge surface 66 is flush with the Z-axis-direction upper surface of the intermediate connector 50 illustrated in FIG. 1 in the present embodiment, the two surfaces may not be flush with each other.

As illustrated in FIGS. 1 and 2B, two accommodation spaces disposed along the X-axis direction are formed in the accommodation recess 62 by the intermediate connector 50 being inserted into the accommodation recess 62. The size of the accommodation recess 62 is a size at which the two capacitor chips 20a and 20b can be accommodated side by side in the X-axis direction.

The width of the accommodation recess 62 in the Y-axis direction is determined such that the capacitor chips 20a and 20b are capable of entering the accommodation recess 62. The depth of the accommodation recess 62 in the Z-axis direction is determined such that the upper ends of the capacitor chips 20a and 20b in the Z-axis direction do not jump upward in the Z-axis direction from the opening edge surface 66 in a case where the capacitor chips 20a and 20b are accommodated in the accommodation recess 62.

Alternatively, the upper ends of the capacitor chips 20a and 20b in the Z-axis direction may slightly jump upward in the Z-axis direction from the opening edge surface 66. An insulator such as ceramic, glass, and synthetic resin constitutes the insulation case 60. A flame-retardant material may constitute the insulator.

In the present embodiment, the capacitor chips 20a and 20b can be easily accommodated in the accommodation recess 62. It is possible to effectively protect the capacitor chips 20a and 20b from an impact or the like by accommodating the capacitor chips 20a and 20b in the accommodation recess 62 as described above.

An engagement projection 67 is formed in each corner portion (at each of the four corners) of the opening surface of the accommodation recess 62. Engagement pieces 324 and 324 (described later) of the individual metal terminals 30 and 30 are respectively engaged with (fixed to) the engagement projections 67.

Two engagement grooves 69 and 69 extending in the Z-axis direction are formed in inner wall surfaces (inside surfaces) of the outer wall 61. Each engagement groove 69 is formed inside a wall surface of the outer wall 61 that is parallel to the X-Z plane (wall surface elongated in the X-axis direction) and is positioned at a halfway position of the wall surface in the longitudinal direction (substantially at the center of the wall surface in the X-axis direction).

The engagement groove 69 is continuously formed from the upper end of the outer wall 61 to the lower end of the outer wall 61. The X-axis-direction width and the Y-axis-direction depth of the engagement groove 69 are widths at which the intermediate connector 50 can be inserted and fixed. For example, the X-axis-direction width of the engagement groove 69 is approximately equal to or greater than the plate thickness of the intermediate connector 50.

As illustrated in FIGS. 1 and 2A, the outer wall 61 is provided with the pair of individual metal terminals 30 and 30. In the present embodiment, the pair of individual metal terminals 30 and 30 are disposed so as to face each other in the X-axis direction (longitudinal direction of the insulation case 60).

The pair of individual metal terminals 30 and 30 are identical in configuration to each other. Each of the pair of individual metal terminals 30 and 30 is formed by one conductive plate piece (such as a metal plate) being bent in a substantially C shape. The plate thickness of the metal plate is not particularly limited. It is preferable that the plate thickness is approximately 0.01 to 2.0 mm.

The individual metal terminal 30 has an inside electrode portion 32, which is inserted along the inside wall that is on one side or the other side of the accommodation recess 62 of the insulation case 60 in the X-axis direction. The inside electrode portion 32 comes into contact with and is electrically connected to the first terminal electrode 22 (second terminal electrode 24) of the capacitor chip 20a (20b). The inside electrode portion 32 is provided with a curved portion 320 pressed toward the capacitor chip 20a (20b) by a spring force. An opening edge electrode portion 34 is formed along the opening edge surface 66 so as to be continuous with the inside electrode portion 32.

Figure 5:
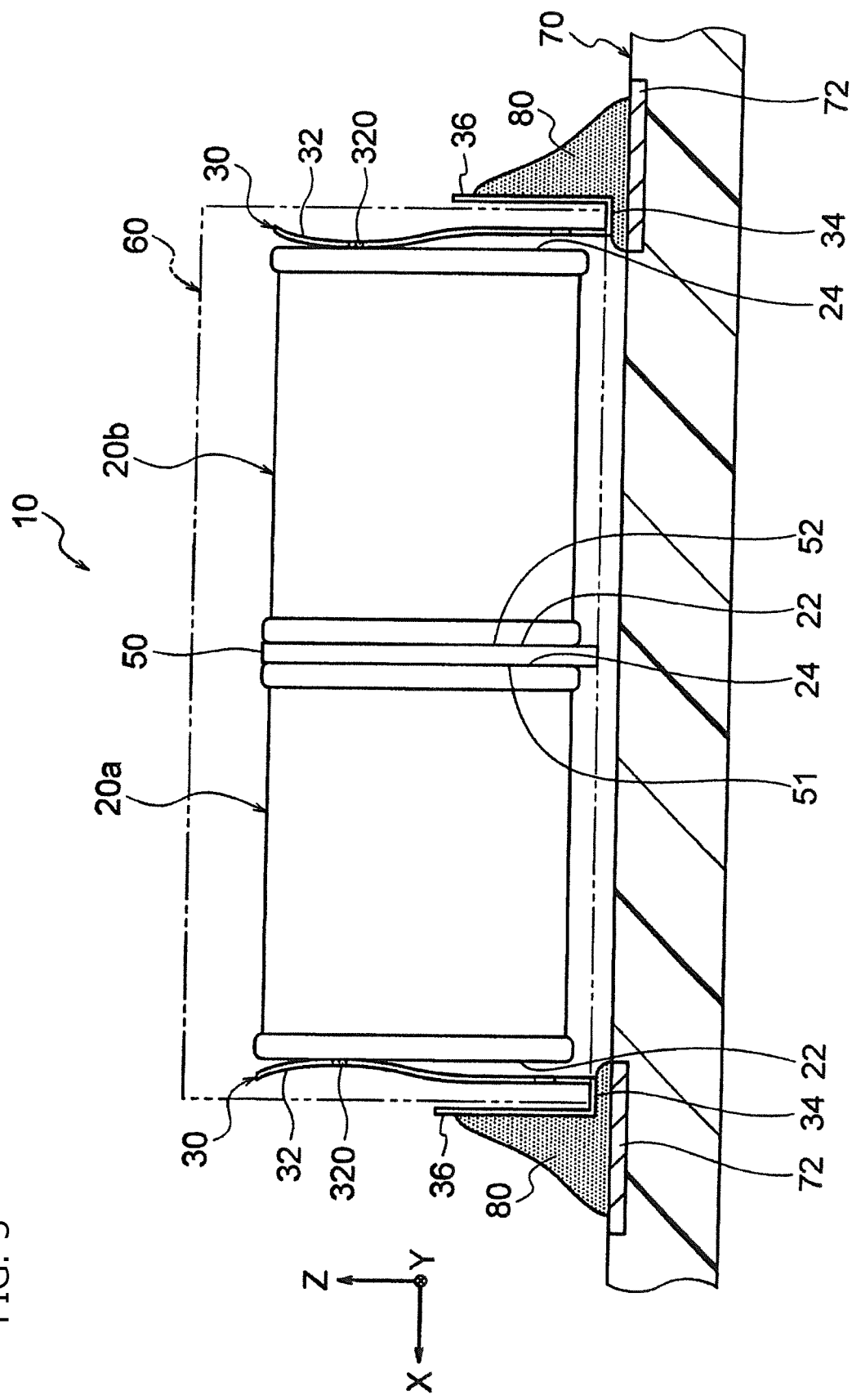
FIG. 5 is a partially transparent side view illustrating an example of the mounting state of the electronic device illustrated in FIG. 4.

In the present embodiment, an elongated through hole 322 is formed along the width direction (Y-axis direction) in the vicinity of the opening edge electrode portion 34 that is in the inside electrode portion 32. By being formed, the through hole 322 is capable of preventing solder rising in the direction of the inside electrode portion 32 when the opening edge electrode portion 34 is connected to a circuit board 70 or the like by means of solder 80 or the like as illustrated in FIG. 5. In other words, a so-called solder bridge can be effectively prevented.

As illustrated in FIGS. 1 and 2A, a side surface electrode portion 36 is formed integrally with the opening edge electrode portion 34, along the outside surface (outside wall) of the outer wall 61 of the insulation case 60, and so as to be continuous with the opening edge electrode portion 34. In the present embodiment, the side surface electrode portion 36 is formed so as to extend in the Z-axis direction along the outside surface of the outer wall 61. The side surface electrode portion 36 does not need to be in contact with the outer wall surface of the outer wall 61. The side surface electrode portion 36 may be disposed in parallel to and with a predetermined gap from the outer wall surface of the outer wall 61. In addition, the opening edge electrode portion 34 and the opening edge surface 66 of the outer wall may have a slight gap although it is preferable that the opening edge electrode portion 34 is in contact with the opening edge surface 66 of the outer wall. In addition, the curved portion 320 is optional and may be omitted. The same applies to various metal terminals to be described later.

The engagement pieces 324 protruding outward along the width direction (Y-axis direction) are formed on both sides in the vicinity of the opening edge electrode portion 34 of the inside electrode portion 32. The engagement pieces 324 can be respectively engaged with the engagement projections 67 formed on both Y-axis-direction sides of the inner wall surfaces on both X-axis-direction sides of the accommodation recess 62 of the insulation case 60 illustrated in FIG. 2B. It is preferable that the engagement projection 67 is formed so as to be flush with the opening edge surface 66.

The engagement piece 324 is engaged with the engagement projection 67 in a one-touch manner simply by the inside electrode portion 32 of the individual metal terminal 30 illustrated in FIG. 2A being inserted into the insulation case 60 illustrated in FIG. 2B. As a result, positioning and firm fixing of the individual metal terminal 30 with respect to the insulation case 60 can be performed with ease.

As illustrated in FIGS. 2A and 5, a conductive and rectangular flat plate constitutes the intermediate connector 50 and the intermediate connector 50 is disposed between the pair of individual metal terminals 30 and 30. The intermediate connector 50 and the pair of individual metal terminals 30 and 30 are disposed along the X-axis direction. The capacitor chips 20a and 20b are disposed on both X-axis-direction sides of the intermediate connector 50.

The intermediate connector 50 interconnects the terminal electrodes 24 and 22 of the adjacent capacitor chips 20a and 20b (disposed in series). In other words, in the present embodiment, the terminal electrodes 24 and 22 of the capacitor chips 20a and 20b are indirectly interconnected via the intermediate connector 50. The intermediate connector 50 is inserted into the accommodation recess 62 through each engagement groove 69 illustrated in FIG. 2B.

The intermediate connector 50 has a first connection surface 51 facing one side in the X-axis direction and a second connection surface 52 facing the other side in the X-axis direction. The connection surfaces 51 and 52 face the side surface electrode portions 36 and 36 of the individual metal terminals 30 and 30. The second terminal electrode 24 of the capacitor chip 20a is connected to the first connection surface 51. The first terminal electrode 22 of the capacitor chip 20b is connected to the second connection surface 52. The capacitor chips 20a and 20b are electrically interconnected via the intermediate connector 50.

Although the area of the intermediate connector 50 (connection surfaces 51 and 52) is larger than the area of the terminal electrodes 24 and 22 of the capacitor chips 20a and 20b, the area of the intermediate connector 50 (connection surfaces 51 and 52) is not particularly limited. The area of the intermediate connector 50 (connection surfaces 51 and 52) may be smaller than in the illustrated example insofar as electrical connection can be ensured between the capacitor chips 20a and 20b. In addition, the intermediate connector 50 may have, for example, a square shape, a circular shape, a triangular shape, or another shape.

In the present embodiment, the capacitor chips 20a and 20b are disposed between the pair of individual metal terminals 30 and 30 with the end surfaces 21 and 23 facing each other. In other words, the capacitor chips 20a and 20b are disposed in series along the X-axis direction in the accommodation recess 62.

The capacitor chip 20a is disposed in the space between one of the individual metal terminals 30 and the intermediate connector 50. The capacitor chip 20a is sandwiched between the individual metal terminal 30 and the intermediate connector 50 while receiving a spring force from the curved portion 320 of the individual metal terminal 30.

The capacitor chip 20b is disposed in the space between the other individual metal terminal 30 and the intermediate connector 50. The capacitor chip 20b is sandwiched between the individual metal terminal 30 and the intermediate connector 50 while receiving a spring force from the curved portion 320 of the individual metal terminal 30.

The electronic device 10 is mounted onto individual circuit patterns 72 and 72 of the circuit board (external circuit) 70 in a state of being turned upside down from the state that is illustrated in FIG. 1. In other words, the mounting surface of the electronic device 10 is on the opening surface side of the accommodation recess 62 illustrated in FIG. 2B. The electronic device 10 is mounted onto the circuit board (external circuit) 70 by the individual metal terminals 30 and 30 (opening edge electrode portions 34 and 34 and side surface electrode portions 36 and 36) and the individual circuit patterns 72 and 72 being interconnected by means of the solder 80, a conductive adhesive, or the like.

A solder fillet is formed between the side surface electrode portions 36 and 36 and the individual circuit patterns 72 and 72. As a result, the electronic device 10 can be firmly fixed to the circuit board (external circuit) 70.

In the present embodiment, the respective terminal electrodes 22 and 24 of the two capacitor chips 20a and 20b are brought into pressure contact with the inside electrode portions 32 and 32 and the intermediate connector 50 in a state where the individual metal terminals 30 and 30 and the intermediate connector 50 are attached to the insulation case 60. The terminal electrodes 22 and 24 of the capacitor chips 20a and 20b may be brought into pressure contact with the inside electrode portions 32 and 32 by an elastic sheet being deformed with the elastic sheet interposed between the inside electrode portions 32 and 32 of the individual metal terminals 30 and 30 and the inner wall surface of the accommodation recess 62.

As illustrated in FIG. 1, the electronic device 10 has connecting portions 100. In the present embodiment, the outer wall 61 of the insulation case 60 is provided with four connecting portions 100. Each of the four connecting portions 100 is either a first engagement portion 110 or a second engagement portion 120 that can be engaged with the first engagement portion 110. In other words, in the present embodiment, each of the first engagement portion 110 and the second engagement portion 120 plays a role as the connecting portion 100.

The first engagement portion 110 and the second engagement portion 120 are formed on the outside surface of the outer wall 61 of the insulation case 60. A pair of the first engagement portions 110 and 110 are formed on the outside surface of the outer wall 61 that is on one side in the Y-axis direction. A pair of the second engagement portions 120 and 120 are formed on the outside surface of the outer wall 61 that is on the other side in the Y-axis direction.

The first engagement portion 110 and the second engagement portion 120 have hook shapes allowing mutual engagement. An L-shaped bent portion forms each of the first engagement portion 110 and the second engagement portion 120. The pair of first engagement portions 110 and 110 are bent toward each other along the X axis (toward the center of the insulation case 60). The pair of second engagement portions 120 and 120 are bent away from each other along the X axis (toward the outside of the insulation case 60).

The pair of first engagement portions 110 and 110 are formed on one end side and the other end side of the insulation case 60 in the X-axis direction, respectively. Likewise, the pair of second engagement portions 120 and 120 are formed on one end side and the other end side of the insulation case 60 in the X-axis direction, respectively.

The first engagement portion 110 and the second engagement portion 120 that are formed on one end side of the insulation case 60 in the X-axis direction are disposed so as to face each other across the outer wall 61. The first engagement portion 110 and the second engagement portion 120 that are formed on the other end side of the insulation case 60 in the X-axis direction are disposed so as to face each other across the outer wall 61.

As illustrated in FIG. 2B, the first engagement portion 110 has a first creepage portion 111 extending in the X-axis direction along the outside surface of the outer wall 61 and a first connection portion (electrode connection portion) 112 interconnecting one X-axis-direction end of the first creepage portion 111 and the outside surface of the outer wall 61. A pair of the first creepage portions 111 and 111 extend toward each other from the portions where the pair of first creepage portions 111 and 111 are respectively connected to a pair of the first connection portions 112 and 112. The first creepage portion 111 and the first connection portion 112 continuously extend from one end of the outer wall 61 to the other end of the outer wall 61 along the Z-axis direction.

The second engagement portion 120 has a second creepage portion 121 extending in the X-axis direction along the outside surface of the outer wall 61 and a second connection portion (electrode connection portion) 122 interconnecting one X-axis-direction end of the second creepage portion 121 and the outside surface of the outer wall 61. A pair of the second creepage portions 121 and 121 extend away from each other from the portions where the pair of second creepage portions 121 and 121 are respectively connected to a pair of the second connection portions 122 and 122. The second creepage portion 121 and the second connection portion 122 continuously extend from one end of the outer wall 61 to the other end of the outer wall 61 along the Z-axis direction.

Figure 4:
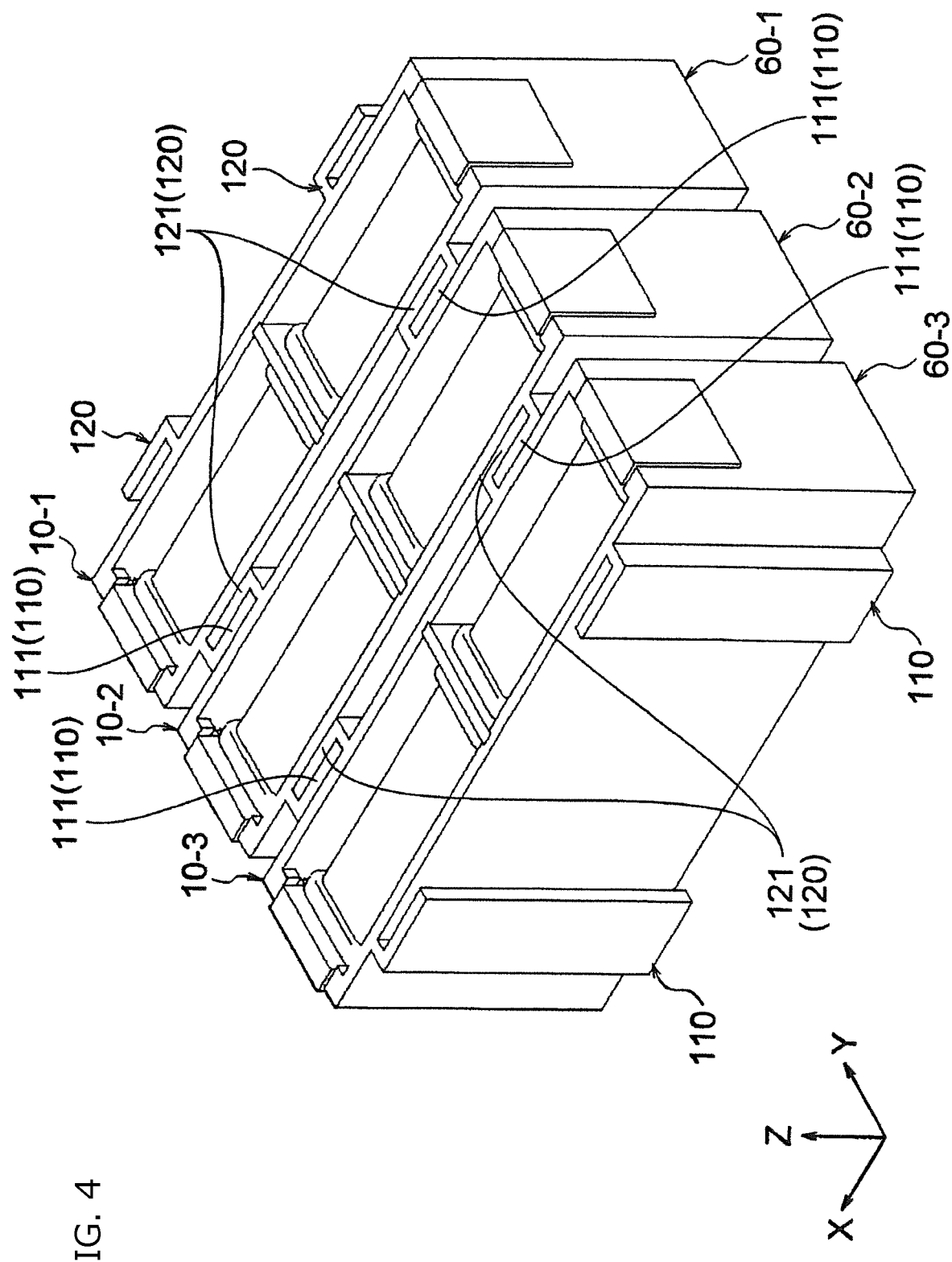
FIG. 4 is a schematic perspective view illustrating a state where three units of the electronic device illustrated in FIG. 1 are interconnected.

As illustrated in FIG. 4, the second creepage portion 121 formed on an insulation case 60_2 is slid in the Z-axis direction and inserted into the gap that is formed between the outside surface of the outer wall 61 and the first creepage portion 111 on an insulation case 60_1. As a result, the pair of first engagement portions 110 and 110 formed on the outer wall 61 of the insulation case 60_1 and the pair of second engagement portions 120 and 120 formed on the outer wall 61 of the insulation case 60_2 are engaged with each other and the insulation case 60_1 and the insulation case 60_2 are connected (fixed) to each other via the connecting portion 100 (first engagement portion 110 and second engagement portion 120). The insulation case 60_1 and the insulation case 60_2 have the same configuration.

In addition, the second creepage portion 121 formed on an insulation case 60_3 is slid in the Z-axis direction and inserted into the gap that is formed between the outside surface of the outer wall 61 and the first creepage portion 111 on the insulation case 60_2. As a result, the pair of first engagement portions 110 and 110 formed on the outer wall 61 of the insulation case 60_2 and the pair of second engagement portions 120 and 120 formed on the outer wall 61 of the insulation case 60_3 are engaged with each other and the insulation case 60_2 and the insulation case 60_3 are connected (fixed) to each other via the connecting portion 100 (first engagement portion 110 and second engagement portion 120). The insulation case 60_2 and the insulation case 60_3 have the same configuration.

As described above, in the present embodiment, the extension directions of the pair of first creepage portions 111 and 111 in the X-axis direction are different from each other and the extension directions of the pair of second creepage portions 121 and 121 in the X-axis direction are different from each other. Accordingly, a movement of each of the insulation cases 60_1 to 60_3 along both sides in the X-axis direction is restricted in a state where the first creepage portions 111 and the second creepage portions 121 are engaged between the insulation case 60_1 and the insulation case 60_2 and between the insulation case 60_2 and the insulation case 60_3.

Hereinafter, a method for manufacturing the electronic device 10 will be described.

Each of the capacitor chips 20a and 20b is manufactured by a general multilayer ceramic capacitor manufacturing method.

A flat plate-shaped metal plate material is prepared first when the individual metal terminal 30 is manufactured. The material of the metal plate material is not particularly limited insofar as the material is a conductive metal material. For example, iron, nickel, copper, silver, and the like or alloys containing these can be used. Next, the metal plate material is machined. As a result, an intermediate member having the shapes of the inside electrode portion 32, the opening edge electrode portion 34, and the side surface electrode portion 36 is obtained.

Next, a plating-based metal coating is formed on the surface of the intermediate member formed by the machining. The individual metal terminal 30 is obtained as a result. The material that is used for the plating is not particularly limited. Examples of the material include Ni, Sn, and Cu. When the individual metal terminals 30 are manufactured, the individual metal terminals 30 may be formed in a state of mutual connection from a metal plate material that is continuous in a band shape.

In a method for manufacturing the intermediate connector 50, an intermediate member having the shape of the intermediate connector 50 may be obtained by the metal plate material being machined and a plating-based metal coating may be formed on the intermediate member. The insulation case 60 can be manufactured by, for example, injection molding. A conductive terminal constituted by a non-metal conductive material may constitute the intermediate connector 50. The same applies to the individual metal terminal 30.

The intermediate connector 50 and the pair of individual metal terminals 30 and 30 obtained as described above are attached to the insulation case 60. The individual metal terminals 30 and 30 can be attached to the insulation case 60 by the inside electrode portions 32 and 32 being respectively inserted along the inner wall surfaces formed on both X-axis-direction sides of the accommodation recess 62 of the insulation case 60. The intermediate connector 50 can be attached to the insulation case 60 by being inserted along the engagement groove 69 formed in the inside surface of the outer wall 61.

Next, the capacitor chips 20a and 20b are inserted into the accommodation recess 62 from above the opening portion. The electronic device 10 illustrated in FIG. 1 can be manufactured as a result. Subsequently, two or more units of the electronic device 10 manufactured as described above are prepared as needed. Then, as illustrated in FIG. 4, the first engagement portions 110 and the second engagement portions 120 are engaged between the insulation case 60_1 and the insulation case 60_2 and between the insulation case 60_2 and the insulation case 60_3. A body in which a plurality of electronic devices 10_1 to 10_3 are joined can be configured as a result.

As illustrated in FIGS. 1 and 4, the electronic device 10 according to the present embodiment has the connecting portions 100 interconnecting the plurality of insulation cases 60_1 to 60_3. Accordingly, the body in which the plurality of electronic devices 10 are joined can be configured by the interconnection of the plurality of insulation cases 60_1 to 60_3 via the connecting portions 100. Accordingly, a user can handle the plurality of electronic devices 10_1 to 10_3 as a single unit. In addition, the user can optimize the configuration into a user-friendly form through arrangement such as increasing or decreasing the number of connections of the insulation cases 60_1 to 60_3 by site of use.

In the present embodiment, the first engagement portion 110 and the second engagement portion 120 are formed on the outside surface of the outer wall 61 of each of the plurality of insulation cases 60_1 to 60_3. Accordingly, it is possible to interconnect the plurality of insulation cases 60_1 to 60_3 via the first engagement portion 110 and the second engagement portion 120 provided on each of the insulation cases 60_1 to 60_3 without separately preparing the connecting portion 100.

In the present embodiment, the first engagement portion 110 and the second engagement portion 120 have hook shapes allowing mutual engagement. Accordingly, it is possible to interconnect the insulation cases 60_1 and 60_2 by meshing (or hooking) between the first engagement portion 110 formed on the insulation case 60_1 and the second engagement portion 120 formed on the insulation case 60_2.

The pair of first engagement portions 110 and 110 are bent toward each other and the pair of second engagement portions 120 and 120 are bent away from each other. Accordingly, the first engagement portions 110 and the second engagement portions 120 bent in the opposite directions are alternately meshed (or hooked) during the engagement between the pair of first engagement portions 110 and 110 formed on the insulation case 60_1 and the pair of second engagement portions 120 and 120 formed on the insulation case 60_2. Accordingly, the insulation case 60_1 and the insulation case 60_2 can be firmly interconnected.

Second Embodiment

Each of electronic devices 10A_1 to 10A_4 according to the embodiment that is illustrated in FIGS. 6A to 7B is similar in configuration, action, and effect to the electronic device 10 according to the first embodiment except for the following points. In FIGS. 6A to 7B, members common to the electronic device 10 of the first embodiment and the electronic devices 10A_1 to 10A_4 according to the embodiment illustrated in FIGS. 6A to 7B are denoted by common reference numerals. Description of the common members will be partially omitted below.

Figure 6A:
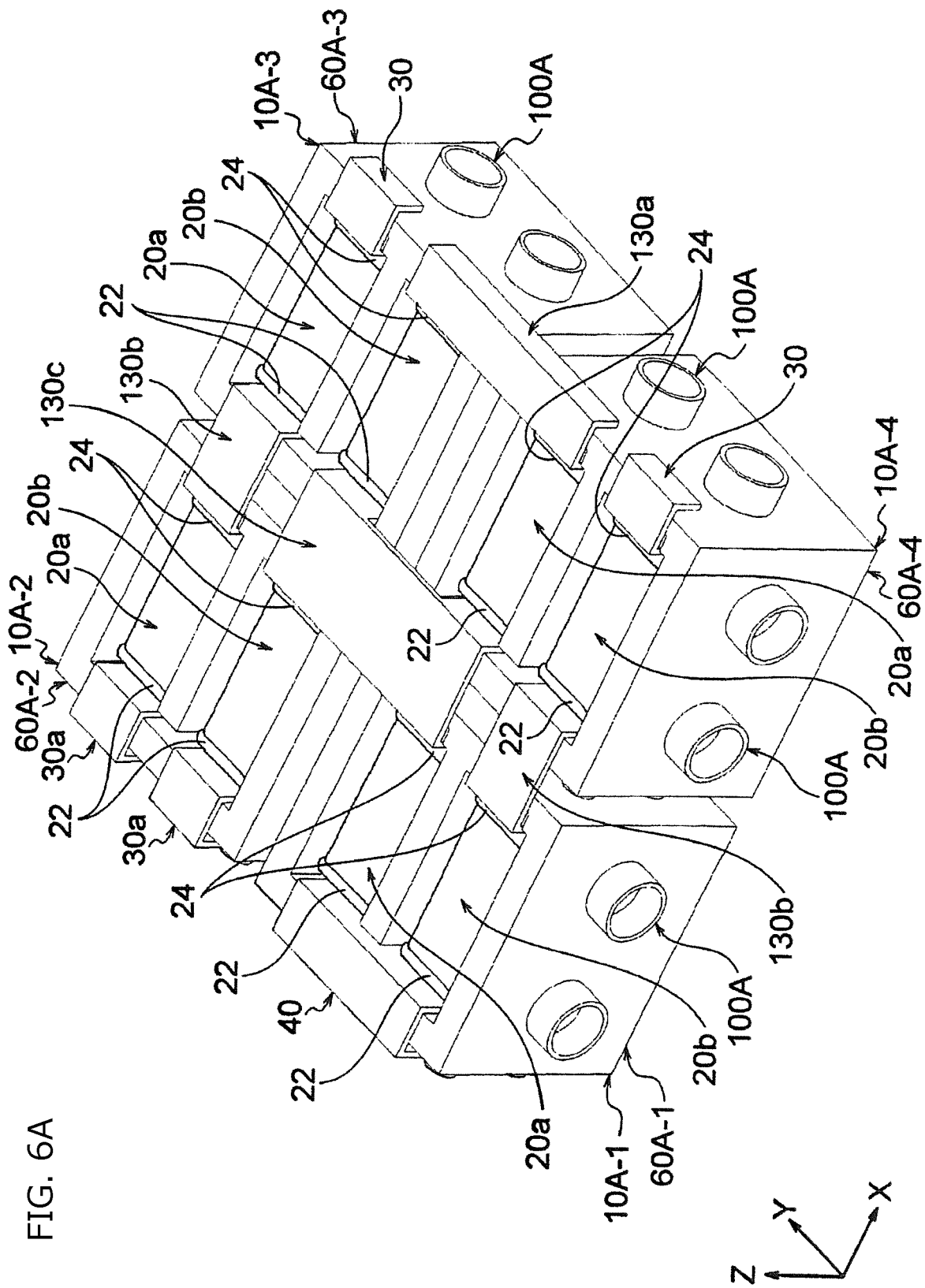
FIG. 6A is a schematic perspective view illustrating a state where four units of an electronic device according to a second embodiment of the invention are interconnected.

As illustrated in FIG. 6A, each of the four electronic devices 10A_1 to 10A_4 has the capacitor chips 20a and 20b, connecting portions 100A, and various metal terminals and the four electronic devices 10A_1 to 10A_4 have insulation cases 60A_1 to 60A_4, respectively. The insulation cases 60A_1 to 60A_4 have the same configuration.

Figure 6B:
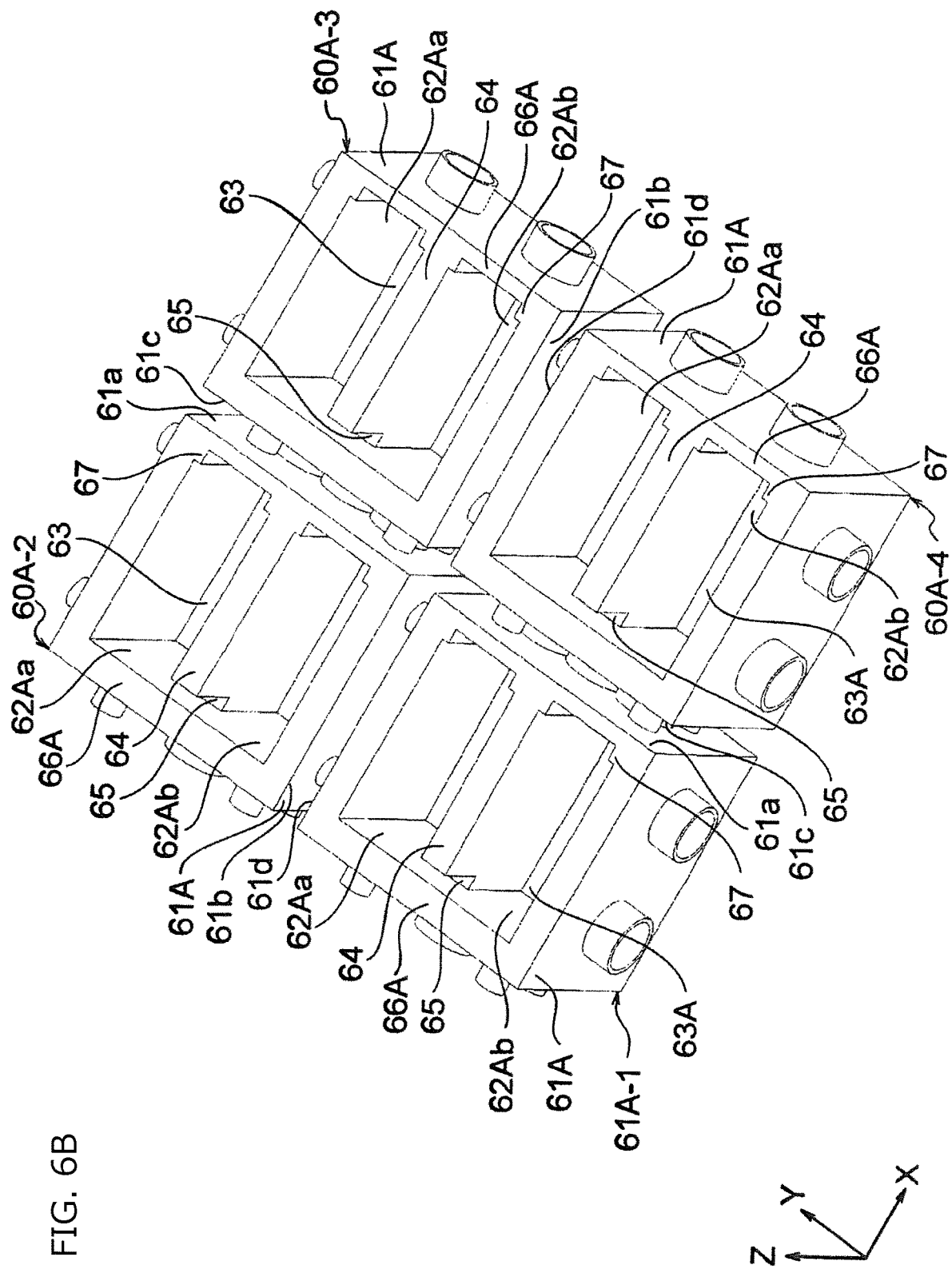
FIG. 6B is a schematic perspective view illustrating the connection state of each case illustrated in FIG. 6A.

As illustrated in FIG. 6B, a substantially cubic housing constitutes each of the insulation cases 60A_1 to 60A_4 and each of the insulation cases 60A_1 to 60A_4 has a bottom wall 63A, a partition wall 64, and an outer wall 61A surrounding a plurality of accommodation recesses 62Aa and 62Ab opening upward in the Z axis. Although most of the accommodation recesses 62Aa and 62Ab, which are adjacent to each other in the Y-axis direction, are partitioned by the partition wall 64, a communication groove 65 provided in the partition wall 64 allows a part of the accommodation recess 62Aa and a part of the accommodation recess 62Ab to communicate with each other.

The communication groove 65 is formed along the inner wall surface that is on one X-axis-direction side of each of the accommodation recesses 62Aa and 62Ab. The Z-axis-direction groove depth of the communication groove 65 is smaller than the Z-axis-direction depth of each of the accommodation recesses 62Aa and 62Ab. The X-axis-direction width of the communication groove 65 is a width at which various metal terminals can be inserted and fixed.

The bottom wall 63A is separately formed for each of the plurality of accommodation recesses 62Aa and 62Ab. The engagement projections 67 are respectively formed in the corner portions of the opening surfaces of the accommodation recesses 62Aa and 62Ab positioned on the side that is opposite to the communication groove 65 in the X-axis direction.

As illustrated in FIG. 6A, in the present embodiment, the electronic devices 10A_1 to 10A_4 are provided with two first individual metal terminals 30 (individual metal terminals 30), two second individual metal terminals 30a, a common metal terminal 40, a first connecting metal terminal 130a, two second connecting metal terminals 130b, and a third connecting metal terminal 130c as metal terminals.

Figure 6C:
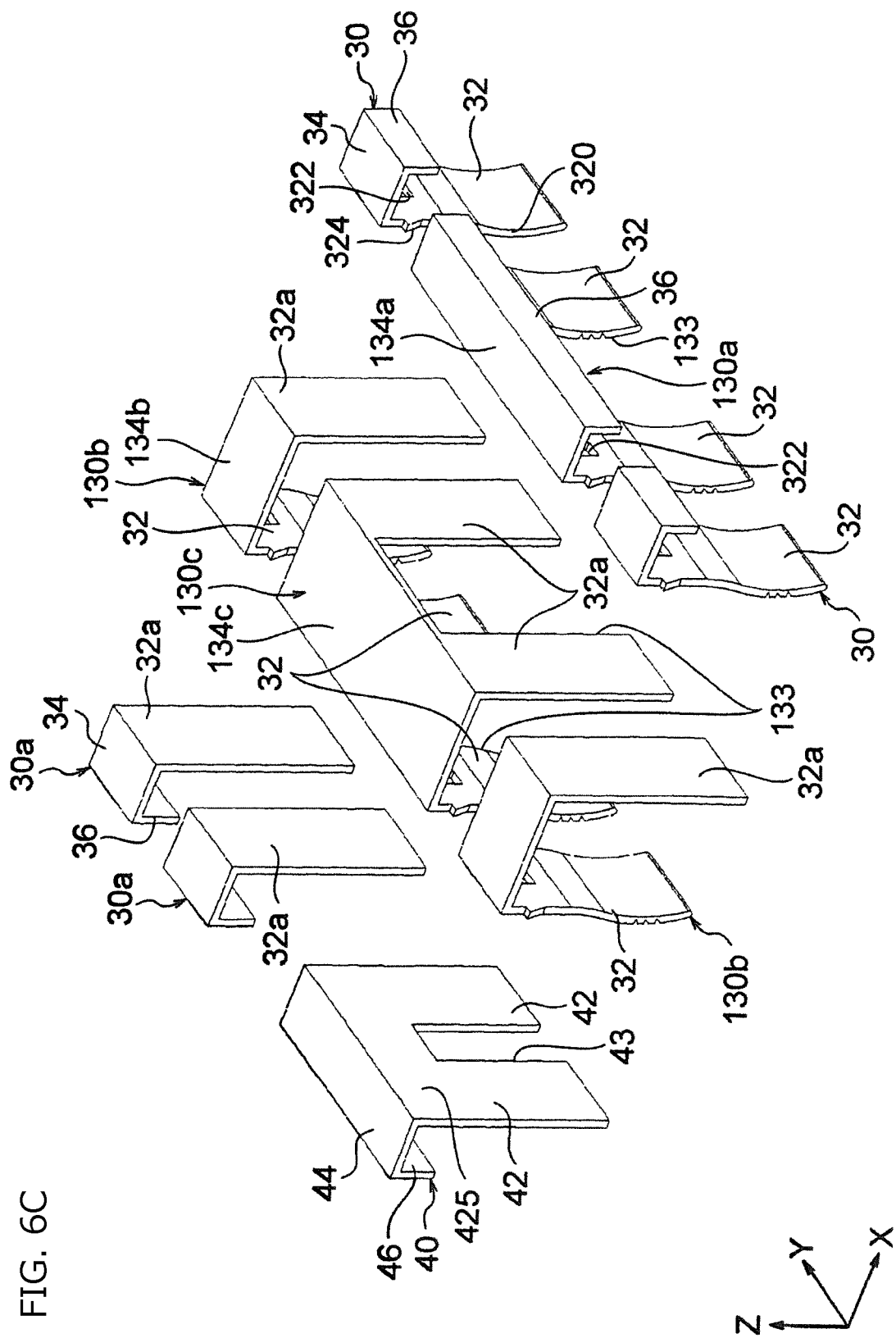
FIG. 6C is a schematic perspective view of various metal terminals illustrated in FIG. 6A.

As illustrated in FIGS. 6A to 6C, in the insulation case 60A_3, one of the two first individual metal terminals 30 is inserted into the X-axis-direction inner wall surface on the side of the accommodation recess 62Aa that is opposite to the side where the communication groove 65 is formed. The inside electrode portion 32 of this first individual metal terminal 30 is connected to the second terminal electrode 24 of the capacitor chip 20a.

In the insulation case 60_4, the other first individual metal terminal 30 is inserted into the X-axis-direction inner wall surface on the side of the accommodation recess 62Ab that is opposite to the side where the communication groove 65 is formed. The inside electrode portion 32 of this first individual metal terminal 30 is connected to the second terminal electrode 24 of the capacitor chip 20b.

As illustrated in FIG. 6C, the second individual metal terminal 30a differs from the first individual metal terminal 30 in that an inside electrode portion 32a is provided with a rectangular flat plate parallel to the Y-Z plane. In other words, the inside electrode portion 32a is not provided with the curved portion 320.

As illustrated in FIGS. 6A to 6C, the two second individual metal terminals 30a are attached to and insulated from the insulation case 60A_2 at a predetermined interval in the Y-axis direction (corresponding to the thickness of the partition wall 64 in the Y-axis direction).

As illustrated in FIG. 6C, the common metal terminal 40 has a pair of inside electrode portions 42 and 42. The inside electrode portions 42 and 42 are separated from each other by a slit 43 extending in the Z-axis direction and are interconnected by a communication piece 425 and an opening edge electrode portion 44. A side surface electrode portion 46 is formed so as to be continuous with the opening edge electrode portion 44. The opening edge electrode portion 44 is continuous with the inside electrode portion 42 and is disposed along an opening edge surface 66A illustrated in FIG. 6B. The side surface electrode portion 46 is continuous with the opening edge electrode portion 44 and is disposed along the outside surface of the outer wall 61A.

As illustrated in FIGS. 6A to 6C, the common metal terminal 40 is provided on the electronic device 10A_1. The inside electrode portion 42 is inserted into the X-axis-direction inner wall surface that is on the side of the accommodation recesses 62Aa and 62Ab where the communication groove 65 is formed and interconnects the first terminal electrodes 22 and 22 of the different capacitor chips 20a and 20b. The inside electrode portions 42 are attached to the inner portions of the accommodation recesses 62Aa and 62Ab along the inner wall surface so as to straddle the accommodation recesses 62Aa and 62Ab through the communication groove 65. The communication piece 425 is engaged with the communication groove 65.

As illustrated in FIG. 6C, the first connecting metal terminal 130a has the pair of inside electrode portions 32 and 32. The inside electrode portion 32 is provided with the through hole 322 having a substantially square shape. The pair of inside electrode portions 32 and 32 are separated from each other by a slit 133 extending in the Z-axis direction and are interconnected (connected to each other) by a connection portion (opening edge electrode portion or electrode connection portion) 134a. The side surface electrode portion 36 is formed so as to be continuous with the connection portion 134a. A substantially rectangular flat plate parallel to the X-Y plane forms the connection portion 134a and the connection portion 134a interconnects the pair of inside electrode portions 32 and 32.

As illustrated in FIGS. 6A to 6C, the first connecting metal terminal 130a is attached across the insulation case 60A_3 and the insulation case 60A_4. In the insulation case 60A_3, one of the pair of inside electrode portions 32 and 32 is inserted into the X-axis-direction inner wall surface on the side of the accommodation recess 62Ab that is opposite to the side where the communication groove 65 is formed and is connected to the second terminal electrode 24 of the capacitor chip 20b.

In the insulation case 60A_4, the other inside electrode portion 32 is inserted into the X-axis-direction inner wall surface on the side of the accommodation recess 62Aa that is opposite to the side where the communication groove 65 is formed and is connected to the second terminal electrode 24 of the capacitor chip 20a.

The connection portion 134a is disposed across the respective opening edge surfaces 66A of the insulation cases 60A_3 and 60A_4 and the side surface electrode portion 36 is disposed across the outside surfaces of the respective outer walls 61 of the insulation cases 60A_3 and 60A_4. As a result, the insulation case 60A_3 and the insulation case 60A_4 are interconnected (connected to each other) via the first connecting metal terminal 130a.

In other words, the first connecting metal terminal 130a has a function of interconnecting the second terminal electrodes 24 and 24 of the capacitor chips 20b and 20a accommodated in the accommodation recesses 62Ab and 62Aa of the two different insulation cases 60A_3 and 60A_4 and a function of interconnecting the insulation cases 60A_3 and 60A_4.

As illustrated in FIG. 6C, the second connecting metal terminal 130b has the inside electrode portions 32 and 32a. The inside electrode portions 32 and 32a are interconnected (connected to each other) by a connection portion (opening edge electrode portion) 134b formed of a substantially rectangular flat plate parallel to the X-Y plane.

As illustrated in FIGS. 6A to 6C, one of the two second connecting metal terminals 130b is attached across the insulation case 60A_2 and the insulation case 60A_3. The other second connecting metal terminal 130b is attached across the insulation case 60A_1 and the insulation case 60A_4.

As for one of the second connecting metal terminals 130b, in the insulation case 60A_2, the inside electrode portion 32 is inserted into the X-axis-direction inner wall surface on the side of the accommodation recess 62Aa that is opposite to the side where the communication groove 65 is formed and is connected to the second terminal electrode 24 of the capacitor chip 20a. In the insulation case 60A_3, the inside electrode portion 32a is inserted into the X-axis-direction inner wall surface that is on the side of the accommodation recess 62Aa where the communication groove 65 is formed and is connected to the first terminal electrode 22 of the capacitor chip 20a.

The connection portion 134b is disposed across the respective opening edge surfaces 66A of the insulation cases 60A_2 and 60A_3. As a result, the insulation case 60A_2 and the insulation case 60A_3 are interconnected (connected to each other) via the second connecting metal terminal 130b.

In other words, one of the second connecting metal terminals 130b has a function of interconnecting the terminal electrodes 24 and 22 of the capacitor chips 20a and 20a accommodated in the accommodation recesses 62Aa and 62Aa of the two different insulation cases 60A_2 and 60A_3 and a function of interconnecting the insulation cases 60A_2 and 60A_3.

As for the other second connecting metal terminal 130b, in the insulation case 60A_1, the inside electrode portion 32 is inserted into the X-axis-direction inner wall surface on the side of the accommodation recess 62Ab that is opposite to the side where the communication groove 65 is formed and is connected to the second terminal electrode 24 of the capacitor chip 20b. In the insulation case 60A_4, the inside electrode portion 32a is inserted into the X-axis-direction inner wall surface that is on the side of the accommodation recess 62Ab where the communication groove 65 is formed and is connected to the first terminal electrode 22 of the capacitor chip 20b.

The connection portion 134b is disposed across the respective opening edge surfaces 66A of the insulation cases 60A_1 and 60A_4. As a result, the insulation case 60A_1 and the insulation case 60A_4 are interconnected (connected to each other) via the second connecting metal terminal 130b.

In other words, the other second connecting metal terminal 130b has a function of interconnecting the terminal electrodes 24 and 22 of the capacitor chips 20b and 20b accommodated in the accommodation recesses 62Ab and 62Ab of the two different insulation cases 60A_1 and 60A_4 and a function of interconnecting the insulation cases 60A_1 and 60A_4.

As illustrated in FIG. 6C, the third connecting metal terminal 130c has the pair of inside electrode portions 32 and 32 and a pair of the inside electrode portions 32a and 32a. The pair of inside electrode portions 32 and 32 are separated from each other by the slit 133 extending in the Z-axis direction. Likewise, the pair of inside electrode portions 32a and 32a are separated from each other by the slit 133 extending in the Z-axis direction. The inside electrode portions 32 and the inside electrode portions 32a are interconnected (connected to each other) by a connection portion (opening edge electrode portion) 134c formed of a substantially rectangular flat plate parallel to the X-Y plane.

As illustrated in FIGS. 6A to 6C, the third connecting metal terminal 130c is attached across the insulation cases 60A_1 to 60A_4. In the insulation case 60A_1, one of the pair of inside electrode portions 32 and 32 is inserted into the X-axis-direction inner wall surface on the side of the accommodation recess 62Aa that is opposite to the side where the communication groove 65 is formed and is connected to the second terminal electrode 24 of the capacitor chip 20a.

In the insulation case 60A_2, the other inside electrode portion 32 is inserted into the X-axis-direction inner wall surface on the side of the accommodation recess 62Ab that is opposite to the side where the communication groove 65 is formed and is connected to the second terminal electrode 24 of the capacitor chip 20b.

In the insulation case 60A_3, one of the pair of inside electrode portions 32a and 32a is inserted into the X-axis-direction inner wall surface on the side of the accommodation recess 62Ab where the communication groove 65 is formed and is connected to the first terminal electrode 22 of the capacitor chip 20b.

In the insulation case 60A_4, the other inside electrode portion 32a is inserted into the X-axis-direction inner wall surface on the side of the accommodation recess 62Aa where the communication groove 65 is formed and is connected to the first terminal electrode 22 of the capacitor chip 20a.

The connection portion 134c is disposed across the respective opening edge surfaces 66A of the insulation cases 60A_1 to 60A_4. As a result, the insulation cases 60A_1 to 60A_4 are interconnected (connected to each other) via the third connecting metal terminal 130c.

In other words, the third connecting metal terminal 130c has a function of interconnecting the terminal electrodes 24, 24, 22, and 22 of the capacitor chips 20a, 20b, 20b, and 20A accommodated in the respective accommodation recesses 62Aa, 62Ab, 62Ab, and 62Aa of the four different insulation cases 60A_1 to 60A_4 and a function of interconnecting the insulation cases 60A_1 to 60A_4.

Figure 7A:
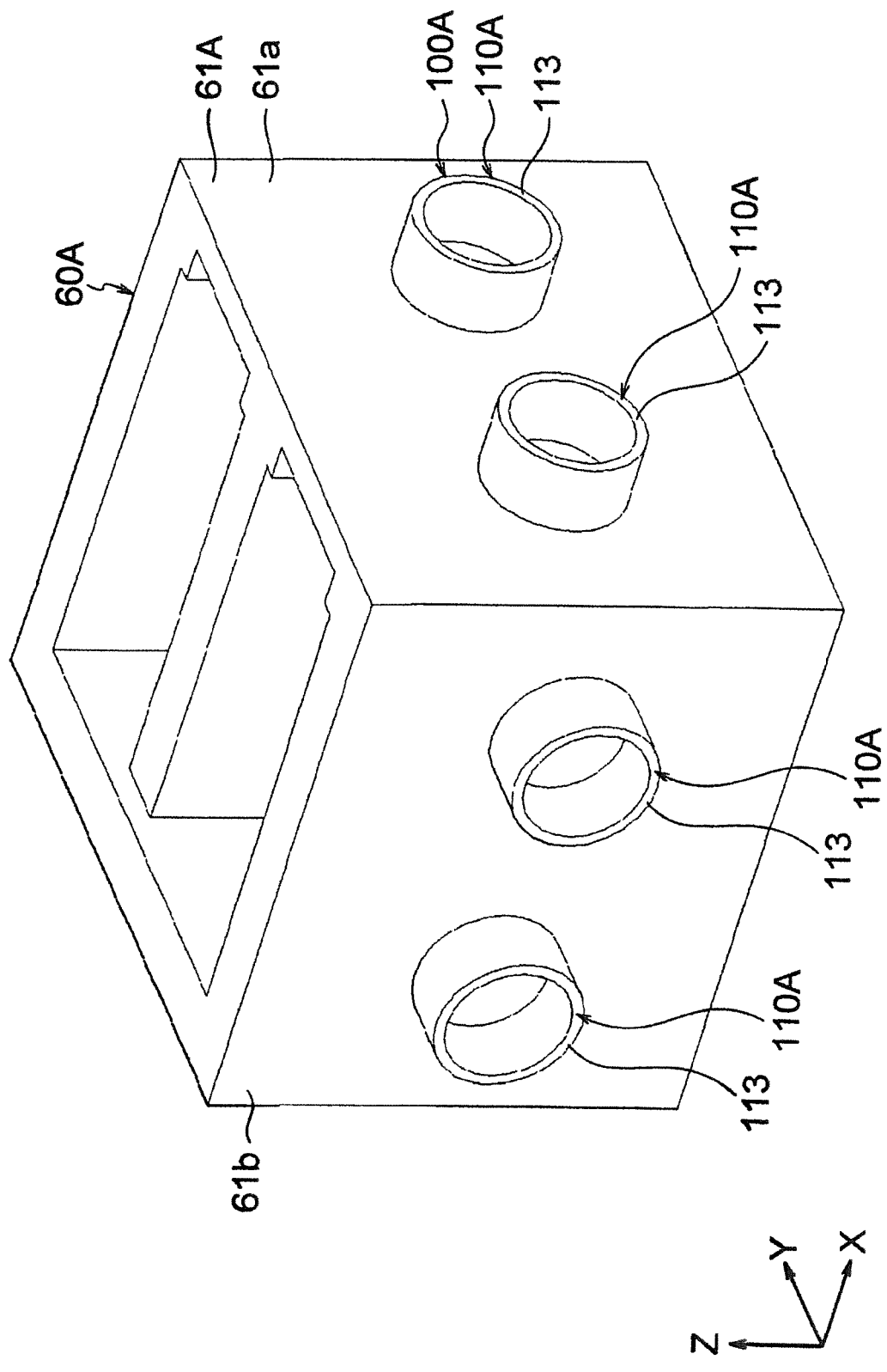
FIG. 7A is a schematic perspective view illustrating the case unit illustrated in FIG. 6B.
Figure 7B:
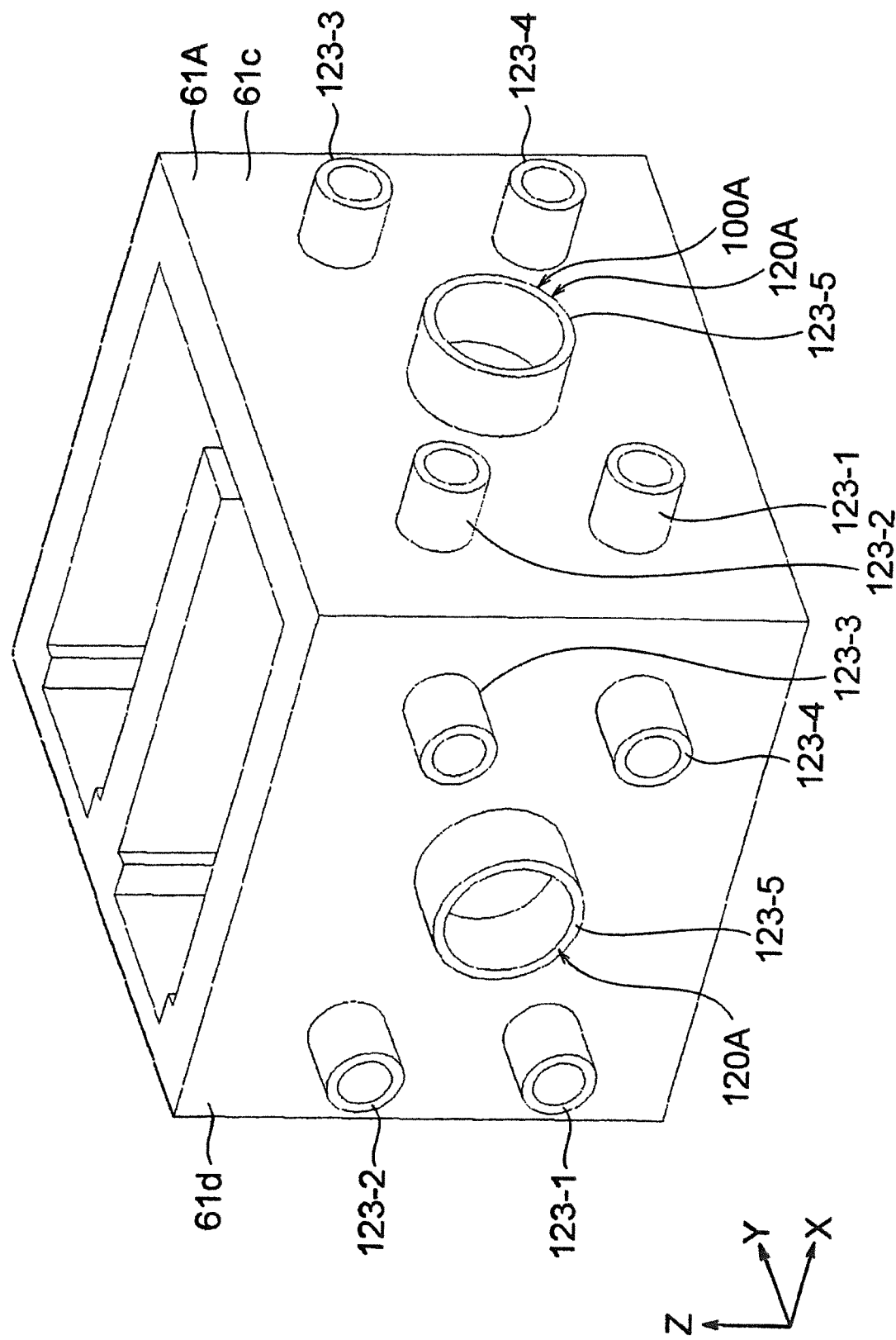
FIG. 7B is a schematic perspective view in which the case illustrated in FIG. 7A is viewed from another angle.

As illustrated in FIGS. 7A and 7B, the connecting portions 100A are provided on the outer wall 61A of the insulation case 60A. The connecting portion 100A is either a first engagement portion 110A or a second engagement portion 120A that can be engaged with the first engagement portion 110A. In other words, in the present embodiment, each of the first engagement portion 110A and the second engagement portion 120A plays a role as the connecting portion 100A.

In the following description, outside surfaces 61a to 61d are the four outside surfaces of the outer wall 61. The outside surface 61a is positioned on the side where the engagement projection 67 is disposed. The outside surface 61b is adjacent to the outside surface 61a in the clockwise direction. The outside surface 61c is positioned on the side that is opposite to the outside surface 61a in the X-axis direction. The outside surface 61d is adjacent to the outside surface 61c in the clockwise direction.

The first engagement portion 110A is formed on each of the outside surfaces 61a and 61b (FIG. 7A) and the second engagement portion 120A is formed on each of the outside surfaces 61c and 61d (FIG. 7B).

A cylindrical first projection 113 protruding toward the outside of the insulation case 60A forms the first engagement portion 110A. In the present embodiment, two units of the first projection 113 are disposed side by side at a predetermined interval in the Y-axis direction and substantially at the center of each of the outside surfaces 61a and 61b in the Z-axis direction.

The assemblage of five second projections 123_1 to 123_5 protruding toward the outside of the insulation case 60A forms the second engagement portion 120A. In the present embodiment, the cylindrical second projection 123_5 is disposed in a substantially central portion of each of the outside surfaces 61c and 62d. The four second projections 123_1 to 123_4 are disposed around the second projection 123_5. The outer diameter of each of the second projections 123_1 to 123_4 is smaller than the outer diameter of the second projection 123_5. The second projection 123_5 is positioned at the intersection of the diagonal lines of a virtual rectangle having each of the second projections 123_1 to 123_4 as a vertex (that is, at the centroid of the rectangle).

The outer diameter of the first projection 113 is approximately equal to the outer diameter of the second projection 123_5. The outer diameter of the first projection 113 is an outer diameter at which the first projection 113 can be fitted into the substantially circular hollow region formed inside each of the second projections 123_1, 123_2, and 123_5 (123_3, 123_4, and 123_5).

As illustrated in FIGS. 6B, 7A, and 7B, the outside surface 61a of the insulation case 60A_1 (60A_2) and the outside surface 61c of the insulation case 60A_4 (60A_3) are disposed so as to face each other in the X-axis direction. One of the pair of first projections 113 and 113 that are formed on the outside surface 61a is sandwiched by each of the second projections 123_1, 123_2, and 123_5 that are formed on the outside surface 61c. The other first projection 113 is sandwiched by each of the second projections 123_3, 123_4, and 123_5 that are formed on the outside surface 61c.

The outside surface 61d of the insulation case 60A_1 (60A_4) and the outside surface 61b of the insulation case 60A_2 (60A_3) are disposed so as to face each other in the Y-axis direction. One of the pair of first projections 113 and 113 that are formed on the outside surface 61b is sandwiched by each of the second projections 123_1, 123_2, and 123_5 that are formed on the outside surface 61d. The other first projection 113 is sandwiched by each of the second projections 123_3, 123_4, and 123_5 that are formed on the outside surface 61d.

As described above, in the present embodiment, the first projection 113 is sandwiched by the assemblage of the plurality of discretely disposed second projections 123_1, 123_2, and 123_5 (123_3, 123_4, and 123_5) (or fitted into the hollow region inside the assemblage). The first engagement portion 110A and the second engagement portion 120A are engaged with each other as a result, and thus the insulation cases 60A_1 to 60A_4 can be interconnected via the connecting portions 100A. In addition, each of the insulation cases 60A_1 to 60A_4 is satisfactorily positioned by the first engagement portion 110A and the second engagement portion 120A.

Third Embodiment

Each of electronic devices 10B_1 to 10B_3 according to the embodiment that is illustrated in FIGS. 8A to 9B is similar in configuration, action, and effect to each of the electronic devices 10A_1 to 10A_4 according to the second embodiment except for the following points. In FIGS. 8A to 9B, members common to the electronic devices 10A_1 to 10A_4 of the second embodiment and the electronic devices 10B_1 to 10B_3 according to the embodiment illustrated in FIGS. 8A to 9B are denoted by common reference numerals. Description of the common members will be partially omitted below.

Figure 8A:
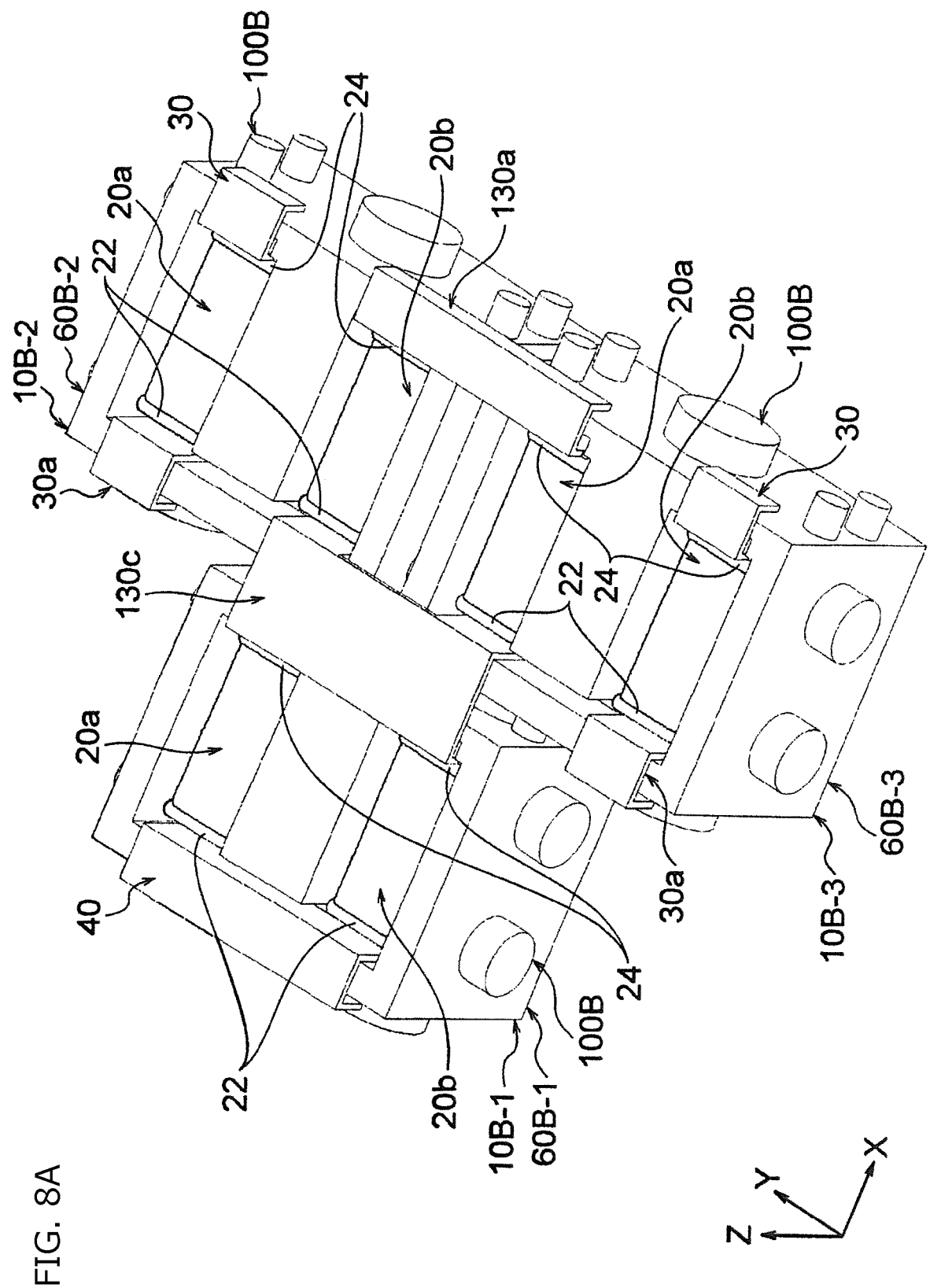
FIG. 8A is a schematic perspective view illustrating a state where three units of an electronic device according to a third embodiment of the invention are interconnected.

As illustrated in FIG. 8A, each of the three electronic devices 10B_1 to 10B_3 has the capacitor chips 20a and 20b, connecting portions 100B, and various metal terminals and the three electronic devices 10B_1 to 10B_3 have insulation cases 60B_1 to 60B_3, respectively. The insulation cases 60B_1 to 60B_3 have the same configuration.

Figure 8B:
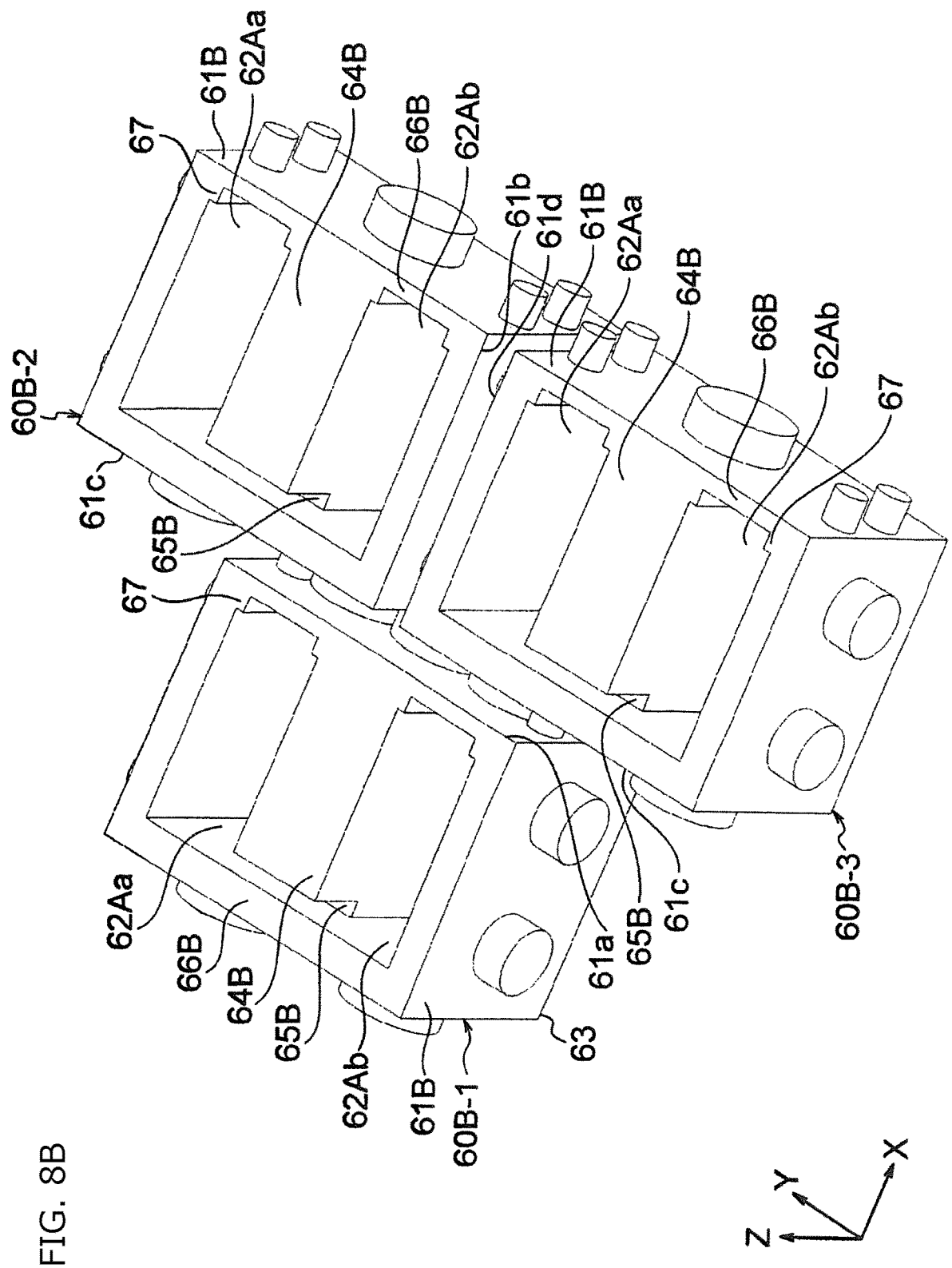
FIG. 8B is a schematic perspective view illustrating the connection state of each case illustrated in FIG. 8A.

As illustrated in FIG. 8B, the insulation cases 60B_1 to 60B_3 differ from the insulation cases 60A_1 to 60A_4 in that a substantially rectangular parallelepiped housing constitutes each of the insulation cases 60B_1 to 60B_3. In other words, in the present embodiment, an outer wall 61B, a bottom wall 63B, a partition wall 64B, a communication groove 65B, and an opening edge surface 66B are formed so as to be longer in the Y-axis direction than the outer wall 61A, the bottom wall 63A, the partition wall 64, the communication groove 65, and the opening edge surface 66A of the second embodiment.

As illustrated in FIG. 8A, in the present embodiment, the electronic devices 10B_1 to 10B_3 are provided with the two first individual metal terminals 30, the two second individual metal terminals 30a, the common metal terminal 40, the first connecting metal terminal 130a, and the third connecting metal terminal 130c as metal terminals.

Figure 8C:
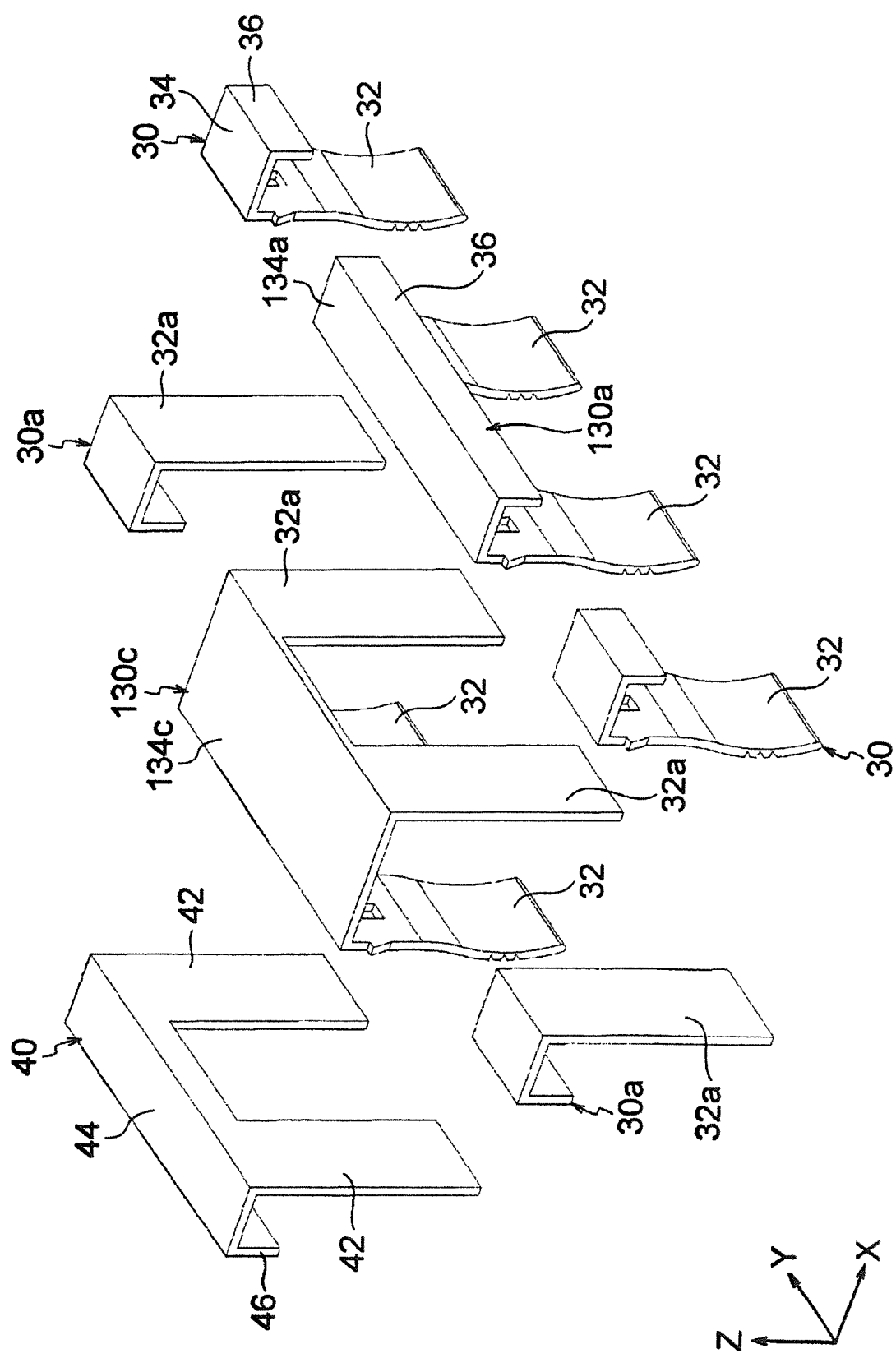
FIG. 8C is a schematic perspective view of various metal terminals illustrated in FIG. 8A.

As illustrated in FIGS. 8A to 8C, in the insulation case 60B_2, one of the two first individual metal terminals 30 is inserted into the X-axis-direction inner wall surface on the side of the accommodation recess 62Aa that is opposite to the side where the communication groove 65B is formed. The inside electrode portion 32 of this first individual metal terminal 30 is connected to the second terminal electrode 24 of the capacitor chip 20a.

In the insulation case 60B_3, the other first individual metal terminal 30 is inserted into the X-axis-direction inner wall surface on the side of the accommodation recess 64Ab that is opposite to the side where the communication groove 65B is formed. The inside electrode portion 32 of this first individual metal terminal 30 is connected to the second terminal electrode 24 of the capacitor chip 20b.

In the insulation case 60B_2, one of the two second individual metal terminals 30a is inserted into the X-axis-direction inner wall surface on the side of the accommodation recess 62Aa where the communication groove 65B is formed. The inside electrode portion 32a of this second individual metal terminal 30a is connected to the first terminal electrode 22 of the capacitor chip 20a.

In the insulation case 60B_3, the other second individual metal terminal 30a is inserted into the X-axis-direction inner wall surface on the side of the accommodation recess 64Ab where the communication groove 65B is formed. The inside electrode portion 32a of this second individual metal terminal 30a is connected to the first terminal electrode 22 of the capacitor chip 20b.

The common metal terminal 40 is provided on the insulation case 60B_1. Each inside electrode portion 42 is inserted into the X-axis-direction inner wall surface that is on the side of the accommodation recesses 62Aa and 62Ab where the communication groove 65B is formed and interconnects the first terminal electrodes 22 and 22 of the different capacitor chips 20a and 20b.

The first connecting metal terminal 130a is attached across the insulation case 60B_2 and the insulation case 60B_3. In the insulation case 60B_2, one of the pair of inside electrode portions 32 and 32 is inserted into the X-axis-direction inner wall surface on the side of the accommodation recess 62Ab that is opposite to the side where the communication groove 65B is formed and is connected to the second terminal electrode 24 of the capacitor chip 20b.

In the insulation case 60B_3, the other inside electrode portion 32 is inserted into the X-axis-direction inner wall surface on the side of the accommodation recess 62Aa that is opposite to the side where the communication groove 65B is formed and is connected to the second terminal electrode 24 of the capacitor chip 20a.

The third connecting metal terminal 130c is attached across the insulation cases 60B_1 to 60B_3. In the insulation case 60B_1, one of the pair of inside electrode portions 32 and 32 is inserted into the X-axis-direction inner wall surface on the side of the accommodation recess 62Aa that is opposite to the side where the communication groove 65B is formed and is connected to the second terminal electrode 24 of the capacitor chip 20a.

In the insulation case 60B_1, the other inside electrode portion 32 is inserted into the X-axis-direction inner wall surface on the side of the accommodation recess 62Ab that is opposite to the side where the communication groove 65B is formed and is connected to the second terminal electrode 24 of the capacitor chip 20b.

In the insulation case 60B_2, one of the pair of inside electrode portions 32a and 32a is inserted into the X-axis-direction inner wall surface on the side of the accommodation recess 62Ab where the communication groove 65B is formed and is connected to the first terminal electrode 22 of the capacitor chip 20b.

In the insulation case 60B_3, the other inside electrode portion 32a is inserted into the X-axis-direction inner wall surface on the side of the accommodation recess 62Aa where the communication groove 65B is formed and is connected to the first terminal electrode 22 of the capacitor chip 20a.

Figure 9A:
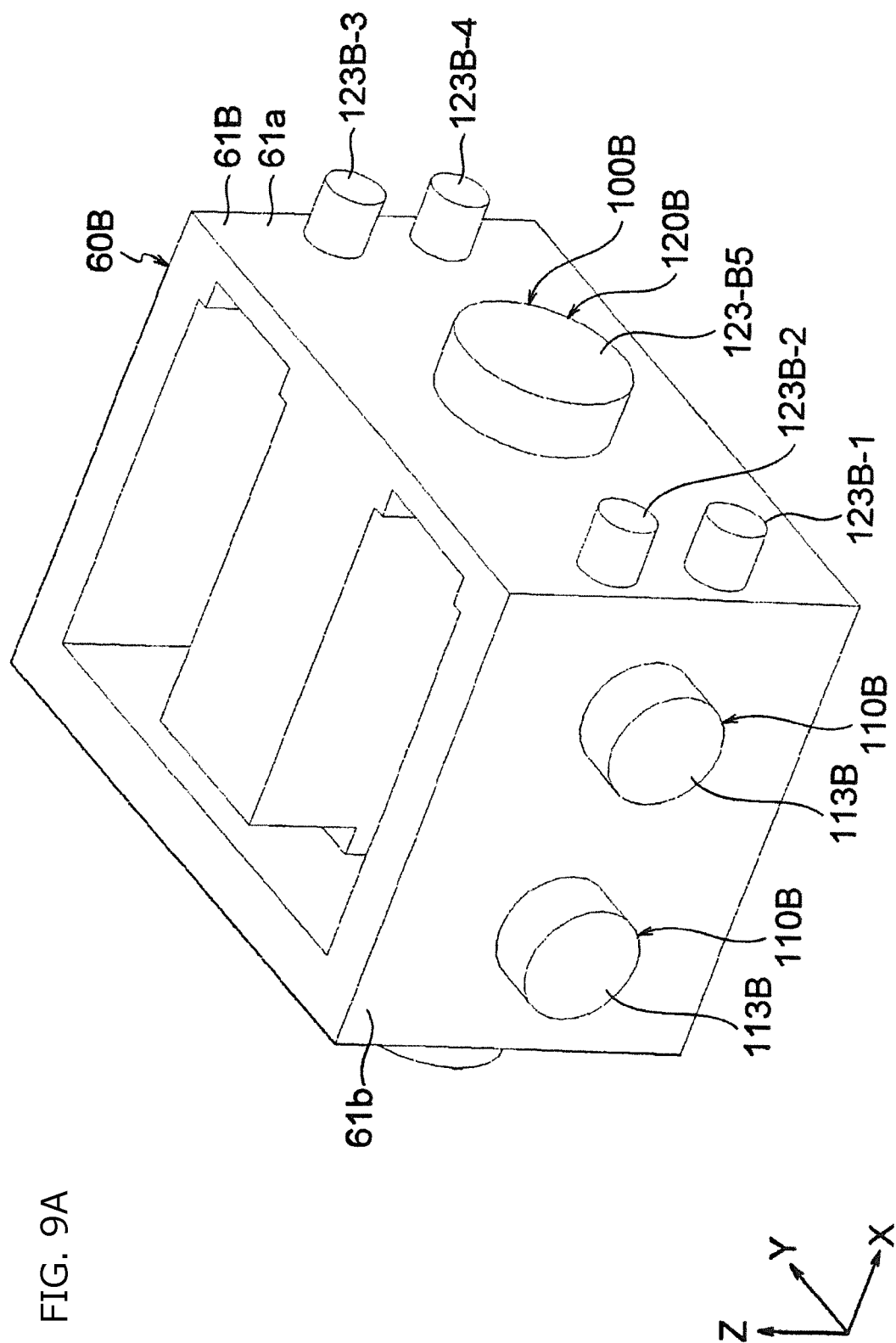
FIG. 9A is a schematic perspective view illustrating the case unit illustrated in FIG. 8B.
Figure 9B:
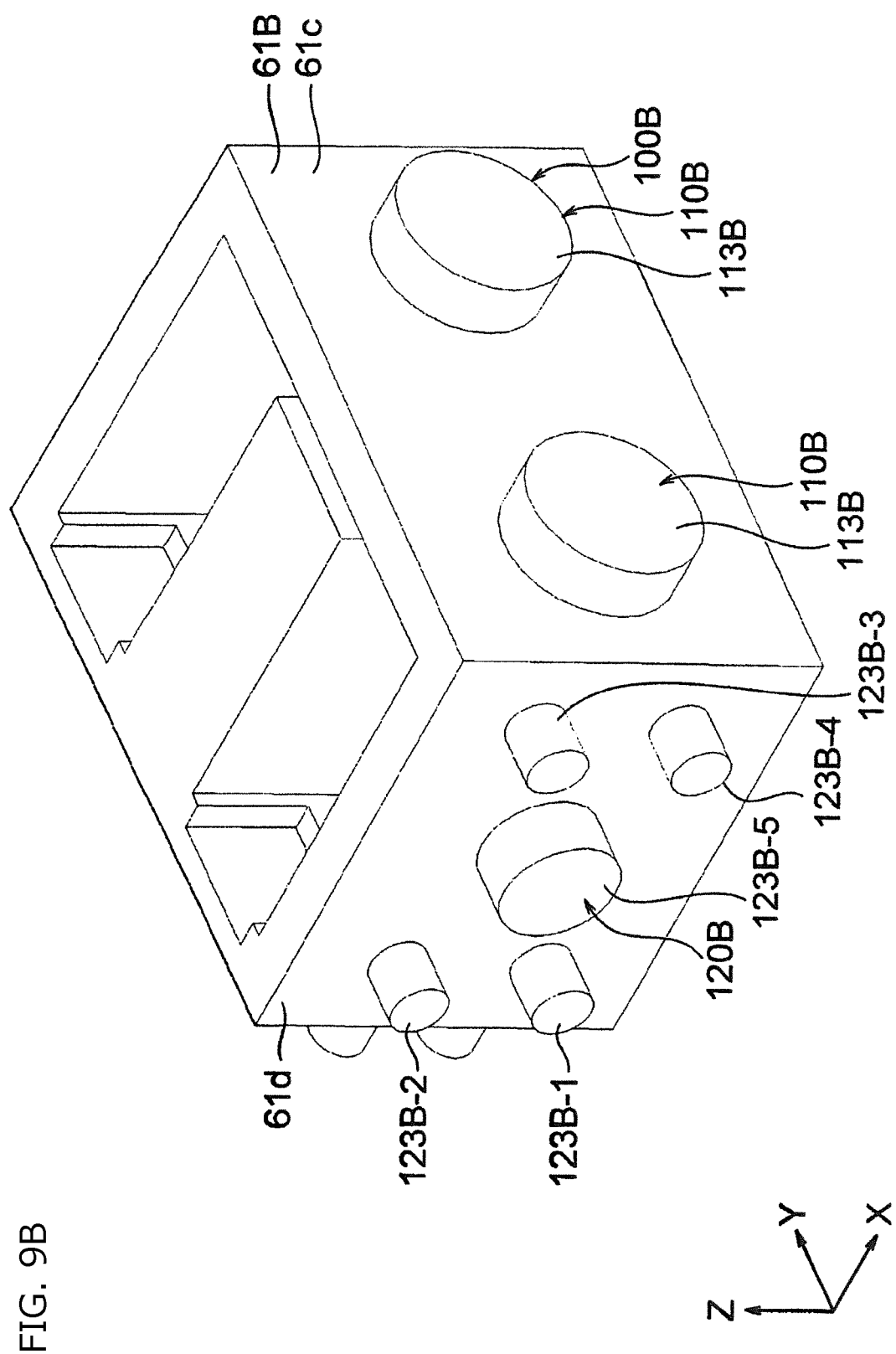
FIG. 9B is a schematic perspective view in which the case illustrated in FIG. 9A is viewed from another angle.

As illustrated in FIGS. 9A and 9B, the connecting portions 100B are provided on the outer wall 61B of the insulation case 60B. The connecting portion 100B is either a first engagement portion 110B or a second engagement portion 120B that can be engaged with the first engagement portion 110B. In other words, in the present embodiment, each of the first engagement portion 110B and the second engagement portion 120B plays a role as the connecting portion 100B.

The first engagement portion 110B is formed on each of the outside surfaces 61b and 61c. The second engagement portion 120B is formed on each of the outside surfaces 61a and 61d. Substantially rectangular surfaces form the outside surfaces 61a and 61c.

In the present embodiment, the interval between two first projections 113B and 113B formed on the outside surface 61c is larger than the interval between the two first projections 113B and 113B formed on the outside surface 61b. In addition, the interval between a second projection 123B_5 and second projections 123B_1 and 123B_2 (123B_3 and 123B_4) formed on the outside surface 61a is larger than the interval between the second projection 123B_5 and the second projections 123B_1 and 123B_2 (123B_3 and 123B_4) formed on the outside surface 61d.

In addition, the diameter of each of the two first projections 113B and 113B formed on the outside surface 61c is larger than the diameter of each of the two first projections 113B and 113B formed on the outside surface 61b. In addition, the diameter of the second projection 123B_5 formed on the outside surface 61a is larger than the diameter of the second projection 123B_5 formed on the outside surface 61d.

Although each of the first projection 113B and the second projections 123B_1 to 123B_5 has a solid columnar shape, each of the first projection 113B and the second projections 123B_1 to 123B_5 may have a cylindrical shape.

As illustrated in FIG. 8B, the outside surface 61c of each of the insulation cases 60B_2 and 60B_3 and the outside surface 61a of the insulation case 60B_1 are disposed so as to face each other in the X-axis direction. In the present embodiment, each of the insulation cases 60B_1 to 60B_3 is misaligned by half the case (half of the Y-axis-direction length of each of the insulation cases 60B_1 to 60B_3).

As illustrated in FIGS. 8B, 9A, and 9B, one of the first projections 113B formed on the outside surface 61c of the insulation case 60B_2 is sandwiched by each of the second projections 123B_3, 123B_4, and 123B_5 formed on the outside surface 61a of the insulation case 60B_1. In addition, one of the first projections 113B formed on the outside surface 61c of the insulation case 60B_3 is sandwiched by each of the second projections 123B_1, 123B_2, and 123B_5 formed on the outside surface 61a of the insulation case 60B_1.

In addition, the outside surface 61b of the insulation case 60B_2 and the outside surface 61d of the insulation case 60B_3 are disposed so as to face each other and one of the pair of first projections 113B and 113B formed on the outside surface 61b is sandwiched by each of the second projections 123B_1, 123B_2, and 123B_5 formed on the outside surface 61d. In addition, the other first projection 113B is sandwiched by each of the second projections 123_3, 123_4, and 123_5 formed on the outside surface 61d.

In this manner, the first engagement portion 110B and the second engagement portion 120B are engaged with each other and the insulation cases 60B_1 to 60B_3 can be interconnected via the connecting portions 100B. In addition, each of the insulation cases 60B_1 to 60B_3 is satisfactorily positioned by the first engagement portion 110B and the second engagement portion 120B.

In the present embodiment, the interval between the two first projections 113B and 113B formed on the outside surface 61c and the interval between the second projection 123B_5 and the second projections 123B_1 and 123B_2 (123B_3 and 123B_4) formed on the outside surface 61a are relatively large. Accordingly, the insulation cases 60B_1 to 60B_3 can be interconnected with the insulation cases 60B_1 to 60B_3 misaligned by half the case. Accordingly, another insulation case 60B can be additionally connected with ease after the interconnection.

Figure 8D:
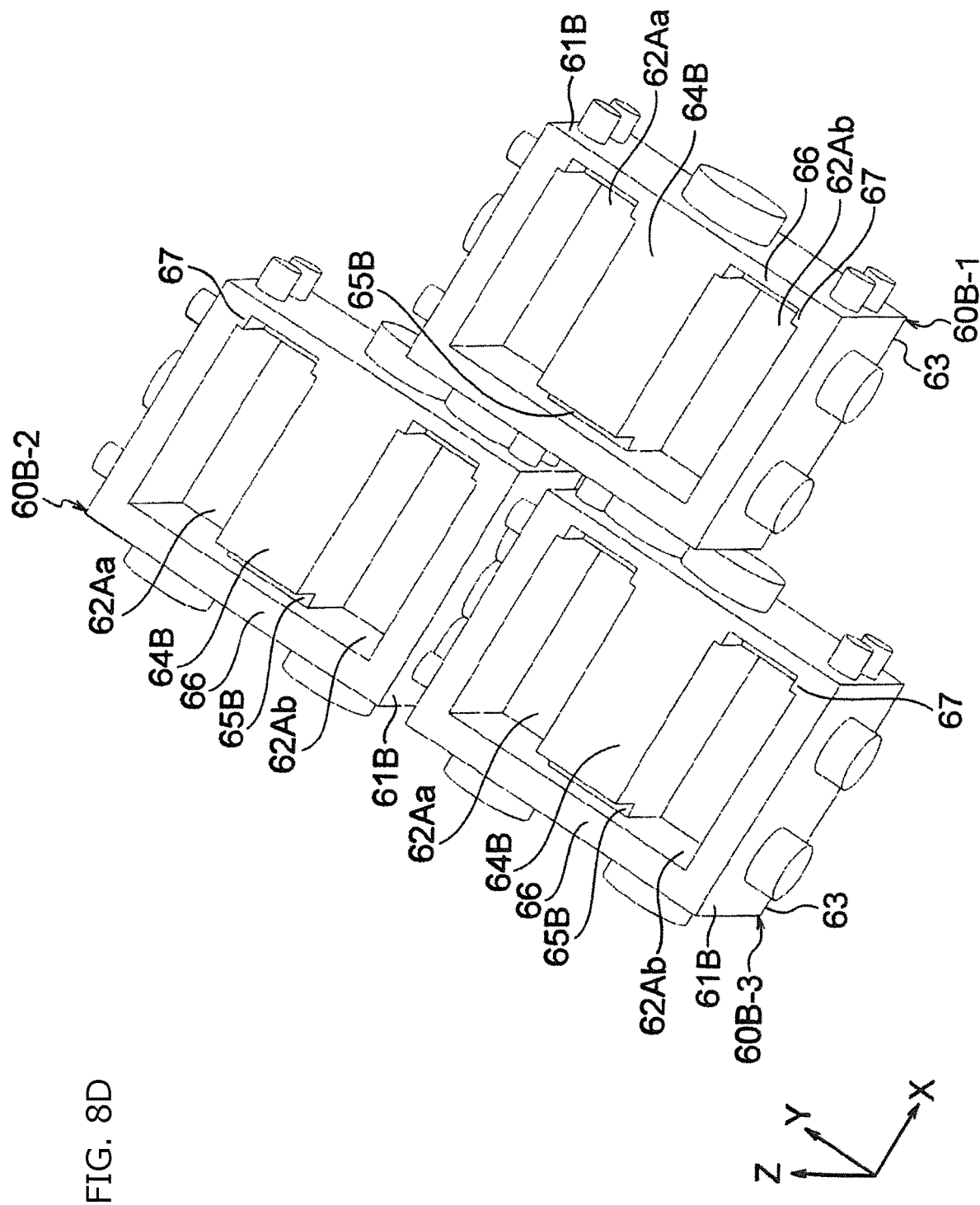
FIG. 8D is another schematic perspective view illustrating the connection state of each case illustrated in FIG. 8A.

The two first engagement portions 110B of the insulation case 60B_1 may be respectively engaged with the second engagement portion 120B of the insulation case 60B_2 and the second engagement portion 120B of the insulation case 60B_3 as illustrated in FIG. 8D such that the disposition of the insulation case 60B_1 is opposite to the disposition in FIG. 8B in the X-axis direction.

Fourth Embodiment

Figure 10B:
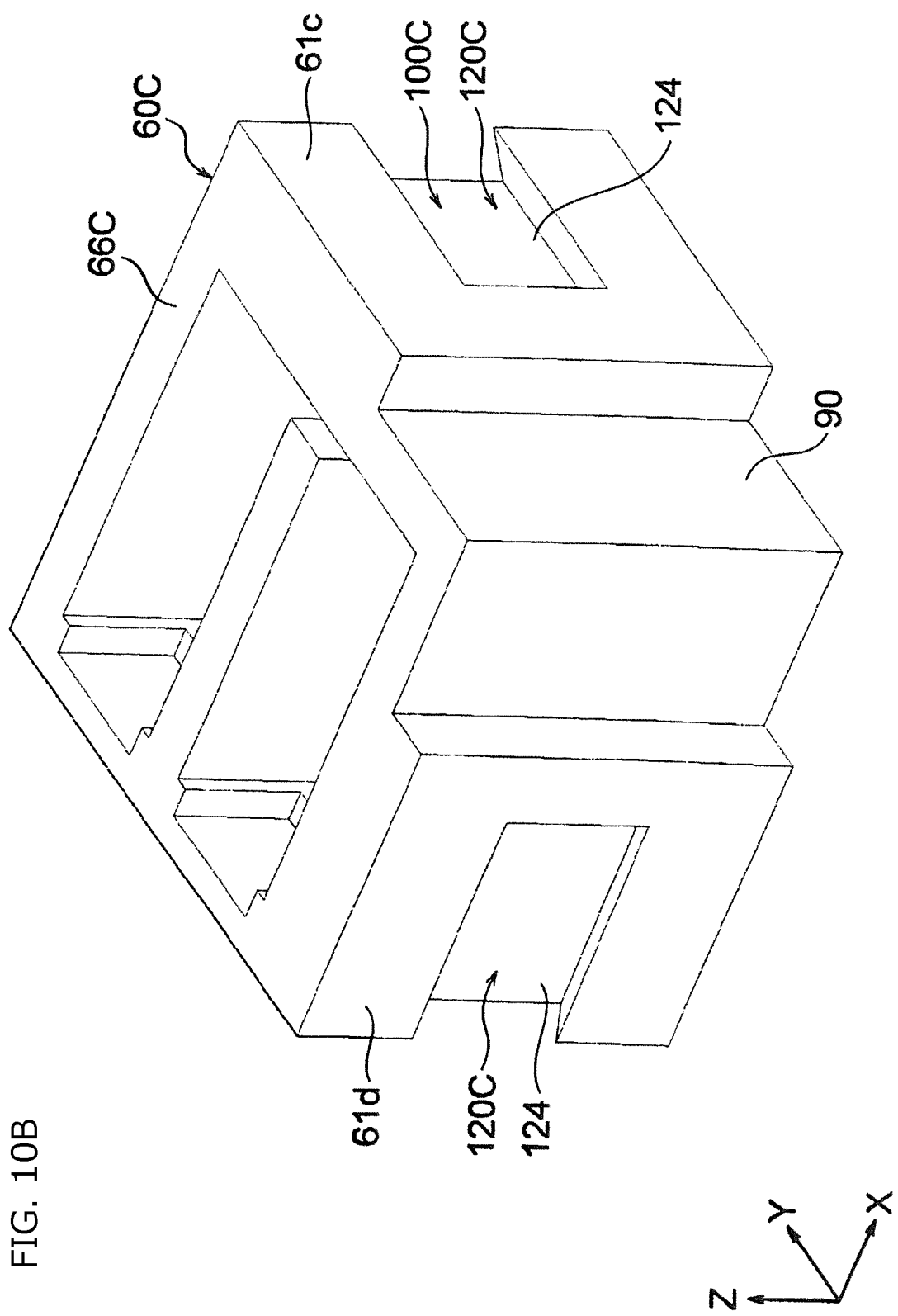
FIG. 10B is a schematic perspective view in which the case illustrated in FIG. 10A is viewed from another angle.
Figure 11:
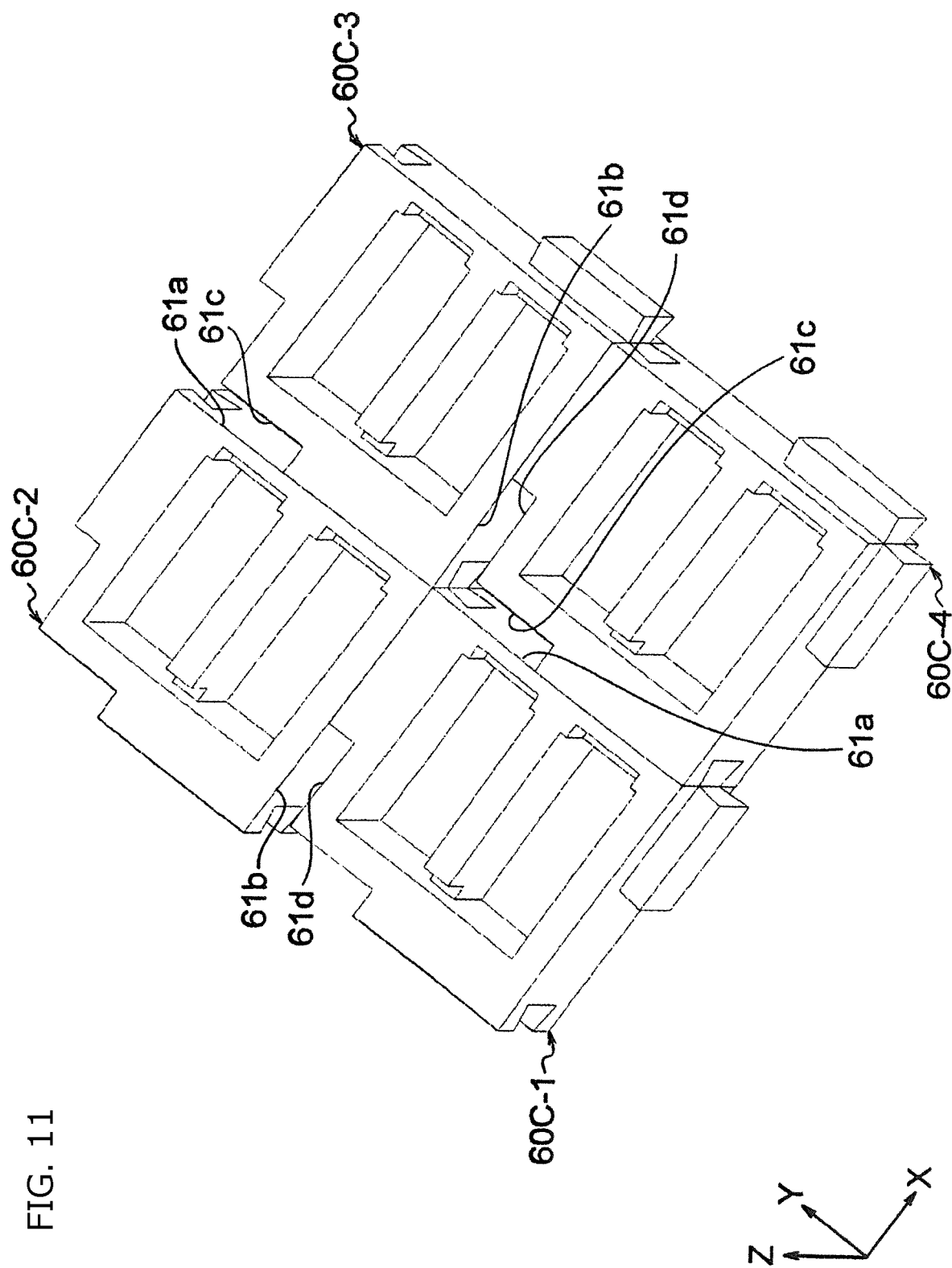
FIG. 11 is a schematic perspective view illustrating a state where four units of the case illustrated in FIG. 10A are interconnected.

An electronic device 10C according to the embodiment that is illustrated in FIGS. 10A to 11 is similar in configuration, action, and effect to each of the electronic devices 10A_1 to 10A_4 according to the second embodiment except for the following points. In FIGS. 10A to 11, members common to the electronic devices 10A_1 to 10A_4 of the second embodiment and the electronic device 10C according to the embodiment illustrated in FIGS. 10A to 11 are denoted by common reference numerals. Description of the common members will be partially omitted below. Regarding the electronic device 10C, an insulation case 60C is illustrated without the capacitor chips 20a and 20b and various metal terminals being illustrated.

As illustrated in FIGS. 10A and 10B, the insulation case 60C has an outer wall 61C. A notch portion 90 is formed in the outside surfaces 61c and 61d of the outer wall 61C. The notch portion 90 is formed in the corner portion between the outside surface 61c and the outside surface 61d and continuously extends from the upper end of the insulation case 60C to the lower end of the insulation case 60C. A part of an opening edge surface 66C is notched by the notch portion 90.

The depth of the notch portion 90 (depth along the thickness direction of the outer wall 61C) is approximately equal to the protrusion width of a first projection 114 (described later). In addition, the length of the notch portion 90 along the outside surfaces 61c and 61d (length along the X-axis or Y-axis direction) is approximately equal to the length of the first projection 114 (described later) along the X-axis or Y-axis direction.

The outer wall 61C of the insulation case 60C is provided with a connecting portion 100C. The connecting portion 100C is either a first engagement portion 110C or a second engagement portion 120C that can be engaged with the first engagement portion 110C. In other words, in the present embodiment, each of the first engagement portion 110C and the second engagement portion 120C plays a role as the connecting portion 100C.

The first engagement portion 110C is formed on each of the outside surfaces 61a and 61b (FIG. 10A) and the second engagement portion 120C is formed on each of the outside surfaces 61c and 61d (FIG. 10B).

The first projection 114 protruding toward the outside of the insulation case 60C forms the first engagement portion 110C. In the present embodiment, the first projection 114 is formed on each of the outside surfaces 61a and 61b and the two first projections 114 and 114 are respectively formed substantially at the centers of the outside surfaces 61a and 61b in the Z-axis direction.

The first projection 114 has a trapezoidal cross-sectional shape and becomes wide along the height direction of the insulation case 60C (Z-axis direction) in the protrusion direction of the first projection 114. One of the first projections 114 extends substantially horizontally along the outside surface 61b of the insulation case 60C from the corner portion between the outside surface 61a and the outside surface 61b to the halfway position of the outside surface 61b in the X-axis direction. The other first projection 114 extends substantially horizontally along the outside surface 61*a* of the insulation case 60C from the corner portion between the outside surface 61*a* and the outside surface 61*b* to the halfway position of the outside surface 61*a* in the Y-axis direction.

A second recess 124 recessed toward the inside of the insulation case 60C (in the thickness direction of the outer wall 61C) forms the second engagement portion 120C. In the present embodiment, the second recess 124 is formed in each of the outside surfaces 61*c* and 61*d* and the two second recesses 124 and 124 are respectively formed substantially at the centers of the outside surfaces 61*c* and 61*d* in the Z-axis direction.

The second recess 124 has a trapezoidal cross-sectional shape and becomes wide along the height direction of the insulation case 60C (Z-axis direction) in the direction that is opposite to the protrusion direction of the first projection 114 (toward the inside of the insulation case 60C). One of the second recesses 124 extends substantially horizontally along the outside surface 61*d* of the insulation case 60C from the corner portion between the outside surface 61*a* and the outside surface 61*d* to the halfway position of the outside surface 61*d* in the X-axis direction. The other second recess 124 extends substantially horizontally along the outside surface 61*c* of the insulation case 60C from the corner portion between the outside surface 61*c* and the outside surface 61*b* to the halfway position of the outside surface 61*c* in the Y-axis direction.

As illustrated in FIGS. 10A, 10B, and 11, the outside surface 61*a* of the insulation case 60C_1 (60C_2) and the outside surface 61*c* of the insulation case 60C_4 (60C_3) are disposed so as to face each other in the X-axis direction. The first projection 114 formed on the outside surface 61*a* is inserted into the second recess 124 formed in the outside surface 61*c* while sliding to the Y-axis positive direction side.

In addition, the outside surface 61*d* of the insulation case 60C_1 (60C_4) and the outside surface 61*b* of the insulation case 60C_2 (60C_3) are disposed so as to face each other in the Y-axis direction. The first projection 114 formed on the outside surface 61*b* is inserted into the second recess 124 formed in the outside surface 61*d* while sliding to the X-axis negative direction side.

As described above, in the present embodiment, the first projection 114 is slid substantially horizontally into the second recess 124. The first engagement portion 110C and the second engagement portion 120C are engaged with each other as a result, and thus the insulation cases 60C_1 to 60C_4, which have the same configuration, can be interconnected. The space that is formed by the notch portion 90 is used when the first engagement portion 110C is engaged with the second engagement portion 120C. As a result, the first projection 114 can be smoothly slid toward the second recess 124.

In the present embodiment, each of the first projection 114 and the second recess 124 has a trapezoidal cross-sectional shape. Accordingly, the first projection 114 is unlikely to escape from the second recess 124 and the connection strength between the cases 60C_1 and 60C_4 can be increased when the first projection 114 formed on the insulation case 60C_1 and the second recess 124 formed in the insulation case 60C_4 are engaged with each other.

In addition, in the present embodiment, the first projection 114 becomes wide along the height direction of the insulation case 60C in the protrusion direction of the first projection 114 and the second recess 124 becomes wide along the height direction of the insulation case 60C in the direction that is opposite to the protrusion direction. Accordingly, the first projection 114 is unlikely to escape from the second recess 124 in the protrusion direction.

In addition, in the present embodiment, the second recesses 124 extend in a substantially horizontal direction along the outside surfaces 61*c* and 61*d* of the insulation case 60C from the corner portions of the insulation case 60C. Accordingly, the engagement between the first engagement portion 110C and the second engagement portion 120C in each of the insulation cases 60C_1 to 60C_4 is unlikely to be released even when an external force along the height direction is applied to the insulation case 60C.

Fifth Embodiment

Figure 12A:
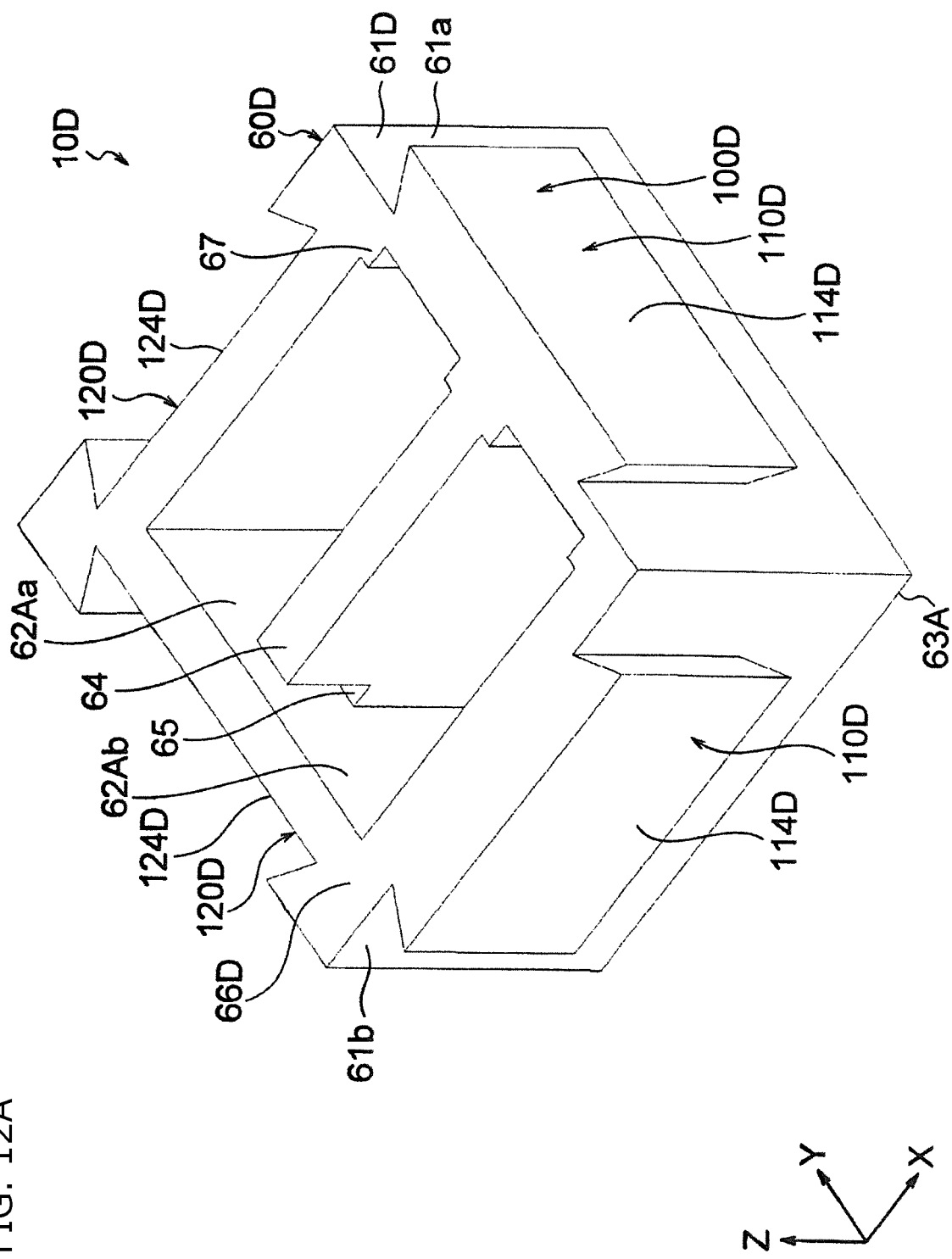
FIG. 12A is a schematic perspective view of a case of an electronic device according to a fifth embodiment of the invention.
Figure 12B:
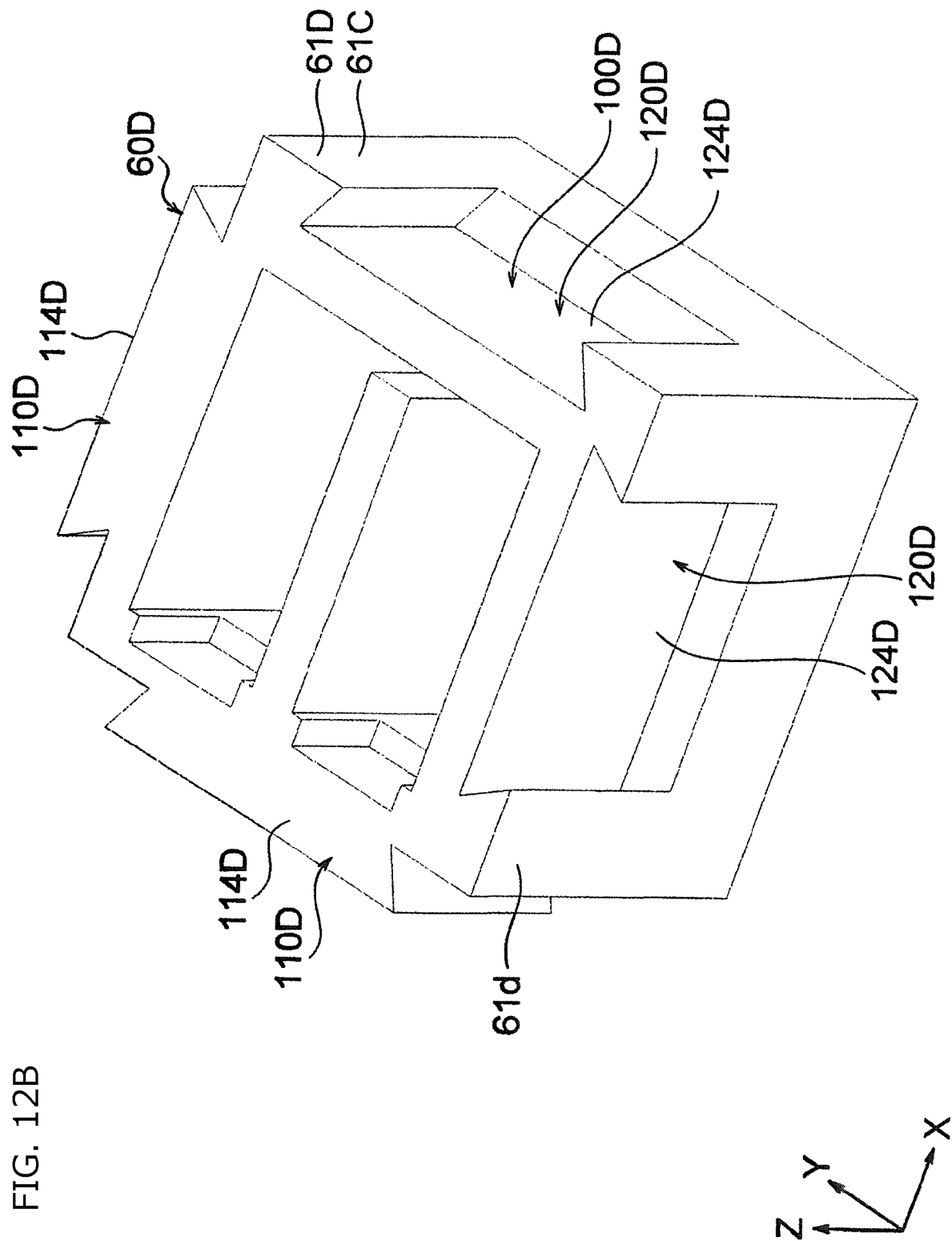
FIG. 12B is a schematic perspective view in which the case illustrated in FIG. 12A is viewed from another angle.
Figure 13:
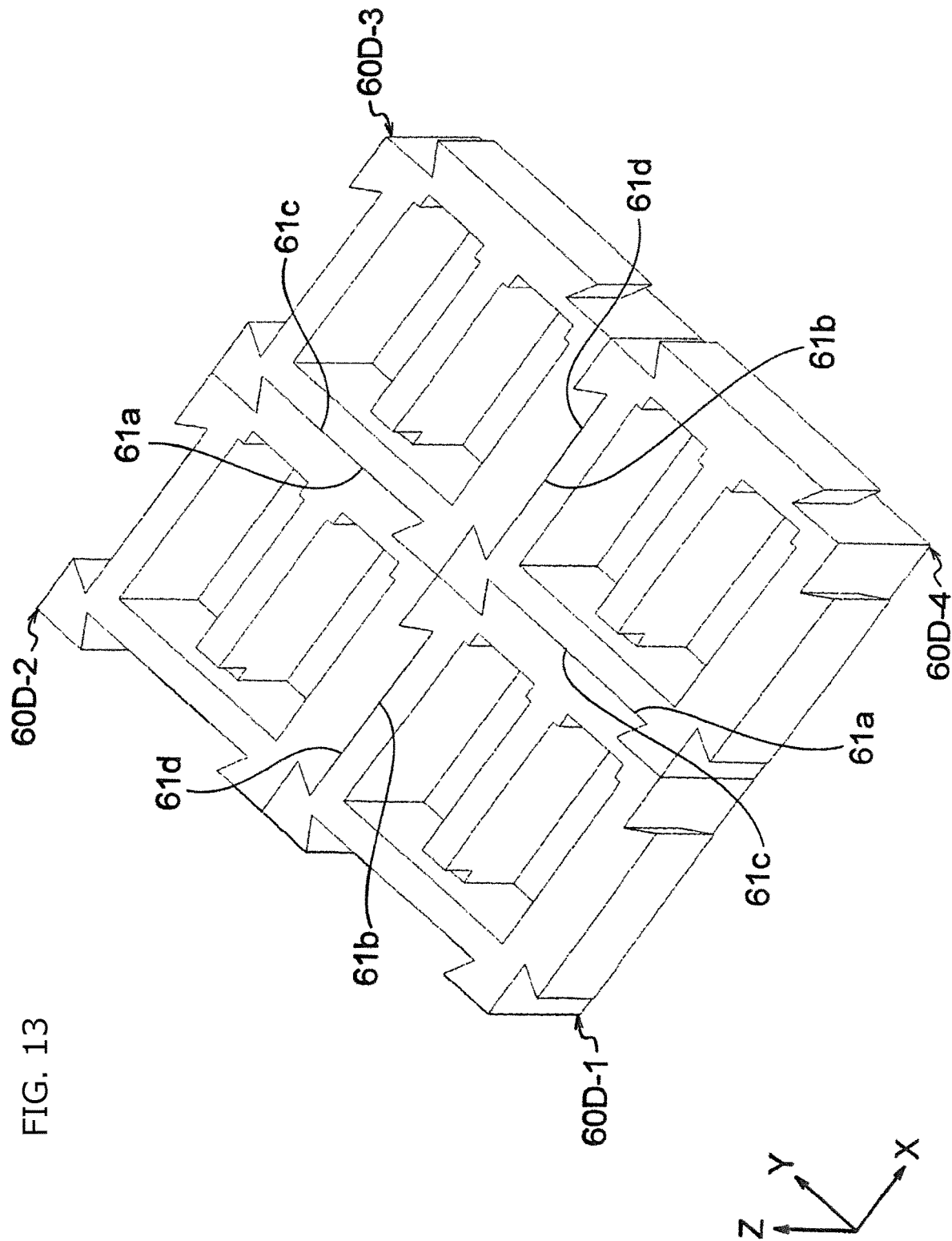
FIG. 13 is a schematic perspective view illustrating a state where four units of the case illustrated in FIG. 12A are interconnected.

An electronic device 10D according to the embodiment that is illustrated in FIGS. 12A to 13 is similar in configuration, action, and effect to the electronic device 10C according to the fourth embodiment except for the following points. In FIGS. 12A to 13, members common to the electronic device 10C of the fourth embodiment and the electronic device 10D according to the embodiment illustrated in FIGS. 12A to 13 are denoted by common reference numerals. Description of the common members will be partially omitted below. Regarding the electronic device 10D, an insulation case 60D is illustrated without the capacitor chips 20*a* and 20*b* and various metal terminals being illustrated.

As illustrated in FIGS. 12A and 12B, the insulation case 60D has an outer wall 61D. The outer wall 61D is provided with a connecting portion 100D. The connecting portion 100D is either a first engagement portion 110D or a second engagement portion 120D that can be engaged with the first engagement portion 110D. In other words, in the present embodiment, each of the first engagement portion 110D and the second engagement portion 120D plays a role as the connecting portion 100D.

The first engagement portion 110D is formed on each of the outside surfaces 61*a* and 61*b* (FIG. 12A) and the second engagement portion 120D is formed on each of the outside surfaces 61*c* and 61*d* (FIG. 12B).

A first projection 114D protruding toward the outside of the insulation case 60D forms the first engagement portion 110D. In the present embodiment, the first projection 114D is formed on each of the outside surfaces 61*a* and 61*b* and the two first projections 114D and 114D are respectively formed substantially at the centers of the outside surfaces 61*a* and 61*b* in the width direction.

The first projection 114D has a trapezoidal cross-sectional shape and becomes wide along the width direction (X-axis direction/Y-axis direction) perpendicular to the height direction of the insulation case 60C (Z-axis direction) in the protrusion direction of the first projection 114D. One of the first projections 114D extends in a substantially perpendicular direction along the outside surface 61*a* from the corner portion between the outside surface 61*a* and an opening edge surface 66D to the halfway position of the outside surface 61*a* in the Z-axis direction. The other first projection 114D extends in a substantially perpendicular direction along the outside surface 61*b* from the corner portion between the outside surface 61*b* and the opening edge surface 66D to the halfway position of the outside surface 61*b* in the Z-axis direction. A part of the opening edge surface 66D is uneven due to the first projection 114D and a second recess 124D.

The second recess 124D recessed toward the inside of the insulation case 60D (in the thickness direction of the outer wall 61D) forms the second engagement portion 120D. In the present embodiment, the second recess 124D is formed in each of the outside surfaces 61c and 61d and the two second recesses 124D and 124D are respectively formed substantially at the centers of the outside surfaces 61c and 61d in the width direction.

The second recess 124D has a trapezoidal cross-sectional shape and becomes wide along the width direction (X-axis direction/Y-axis direction) perpendicular to the height direction of the insulation case 60D (Z-axis direction) in the direction that is opposite to the protrusion direction of the first projection 114D (toward the inside of the insulation case 60D). One of the second recesses 124D extends in a substantially perpendicular direction along the outside surface 61c from the corner portion between the outside surface 61c and the opening edge surface 66D to the halfway position of the outside surface 61c in the Z-axis direction. The other second recess 124D extends in a substantially perpendicular direction along the outside surface 61d from the corner portion between the outside surface 61d and the opening edge surface 66D to the halfway position of the outside surface 61d in the Z-axis direction.

As illustrated in FIGS. 12A, 12B, and 13, the outside surface 61a of the insulation case 60D_1 (60D_2) and the outside surface 61c of the insulation case 60D_4 (60D_3) are disposed so as to face each other in the X-axis direction. The first projection 114D formed on the outside surface 61a is inserted into the second recess 124D formed in the outside surface 61c while sliding to the Z-axis negative direction side.

In addition, the outside surface 61d of the insulation case 60D_1 (60D_4) and the outside surface 61b of the insulation case 60D_2 (60D_3) are disposed so as to face each other in the Y-axis direction. The first projection 114D formed on the outside surface 61b is inserted into the second recess 124D formed in the outside surface 61d while sliding to the Z-axis negative direction side.

As described above, in the present embodiment, the first projection 114D is slid in a substantially perpendicular direction into the second recess 124D. The first engagement portion 110D and the second engagement portion 120D are engaged with each other as a result, and thus the insulation cases 60D_1 to 60D_4, which have the same configuration, can be interconnected.

In the present embodiment, the first projection 114D becomes wide along the width direction of the insulation case 60D in the protrusion direction of the first projection 114D and the second recess 124D becomes wide along the width direction of the insulation case 60D in the direction that is opposite to the protrusion direction. Accordingly, the first projection 114D is unlikely to escape from the second recess 124D in the protrusion direction.

In addition, in the present embodiment, the second recesses 124D extend in a substantially perpendicular (vertical) direction along the outside surfaces 61c and 61d of the insulation case 60D from the corner portions of the insulation case 60D. Accordingly, the engagement between the first engagement portion 110D and the second engagement portion 120D in each of the insulation cases 60D_1 to 60D_4 is unlikely to be released even when an external force along the width direction is applied to the insulation case 60D.

In addition, in the present embodiment, the thickness of the outer wall 61D of each of the insulation cases 60D_1 to 60D_4 can be relatively large, and thus high strength can be given to each of the insulation cases 60D_1 to 60D_4.

Sixth Embodiment

Figure 14A:
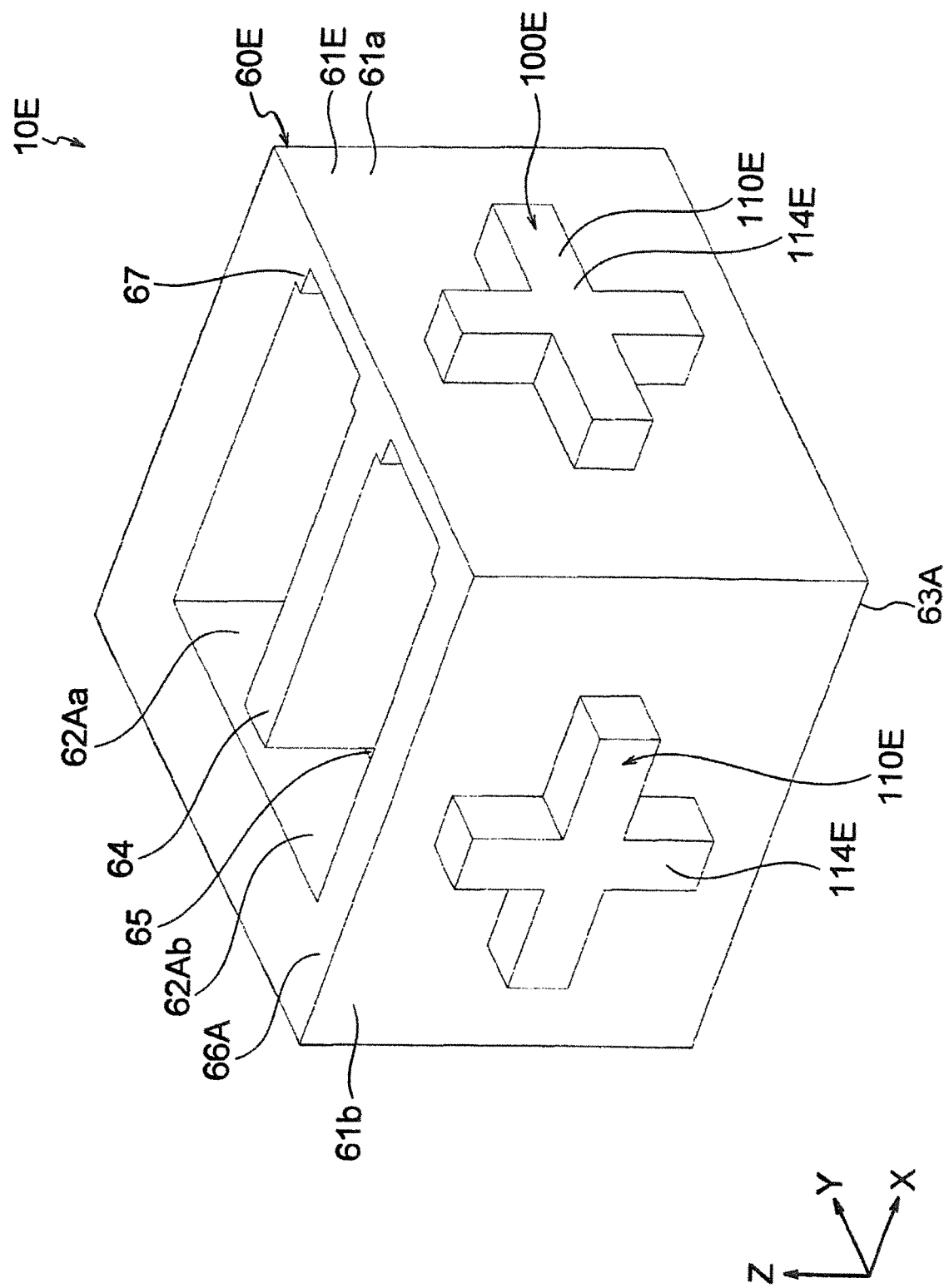
FIG. 14A is a schematic perspective view of a case of an electronic device according to a sixth embodiment of the invention.
Figure 14B:
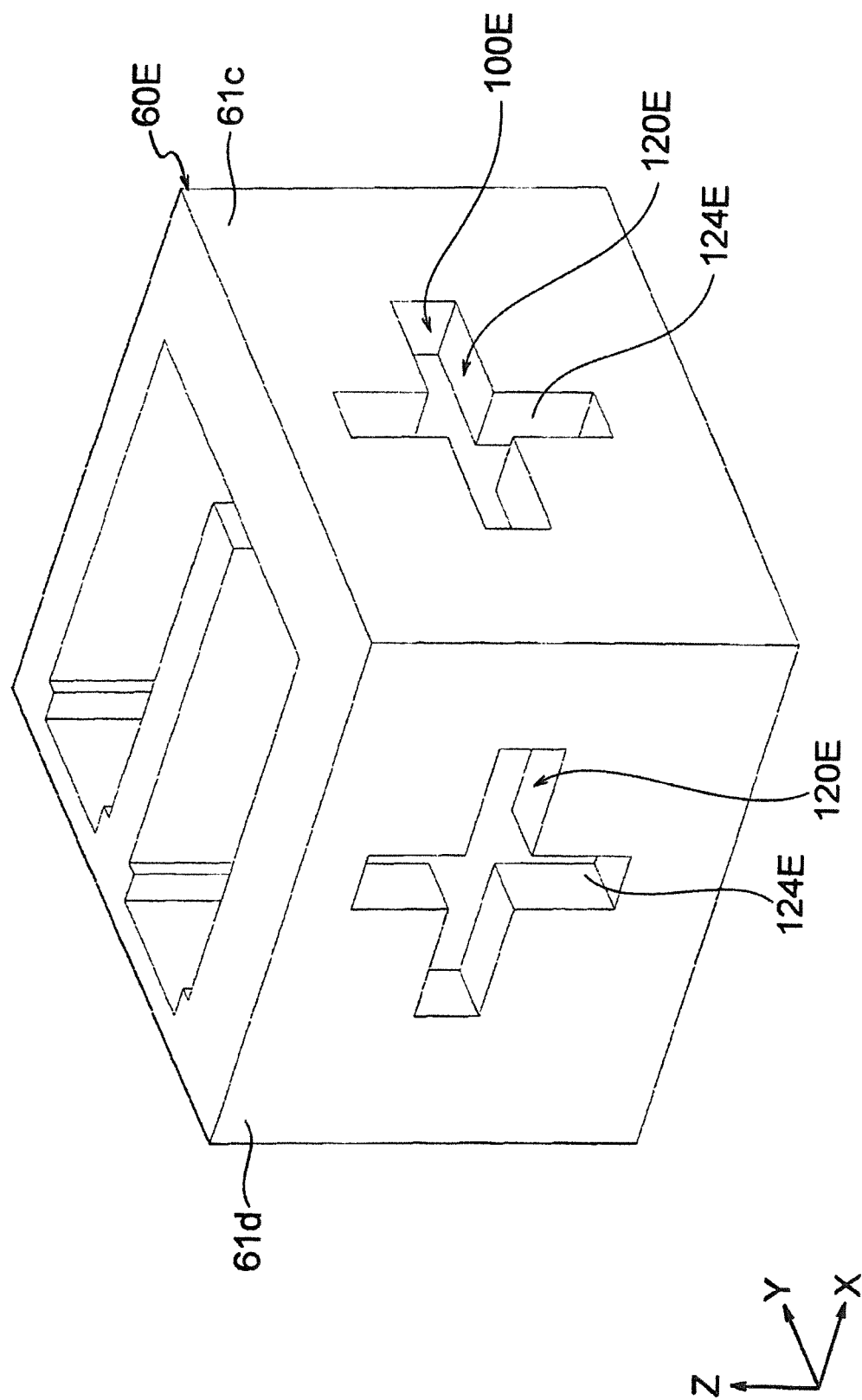
FIG. 14B is a schematic perspective view in which the case illustrated in FIG. 14A is viewed from another angle.
Figure 15:
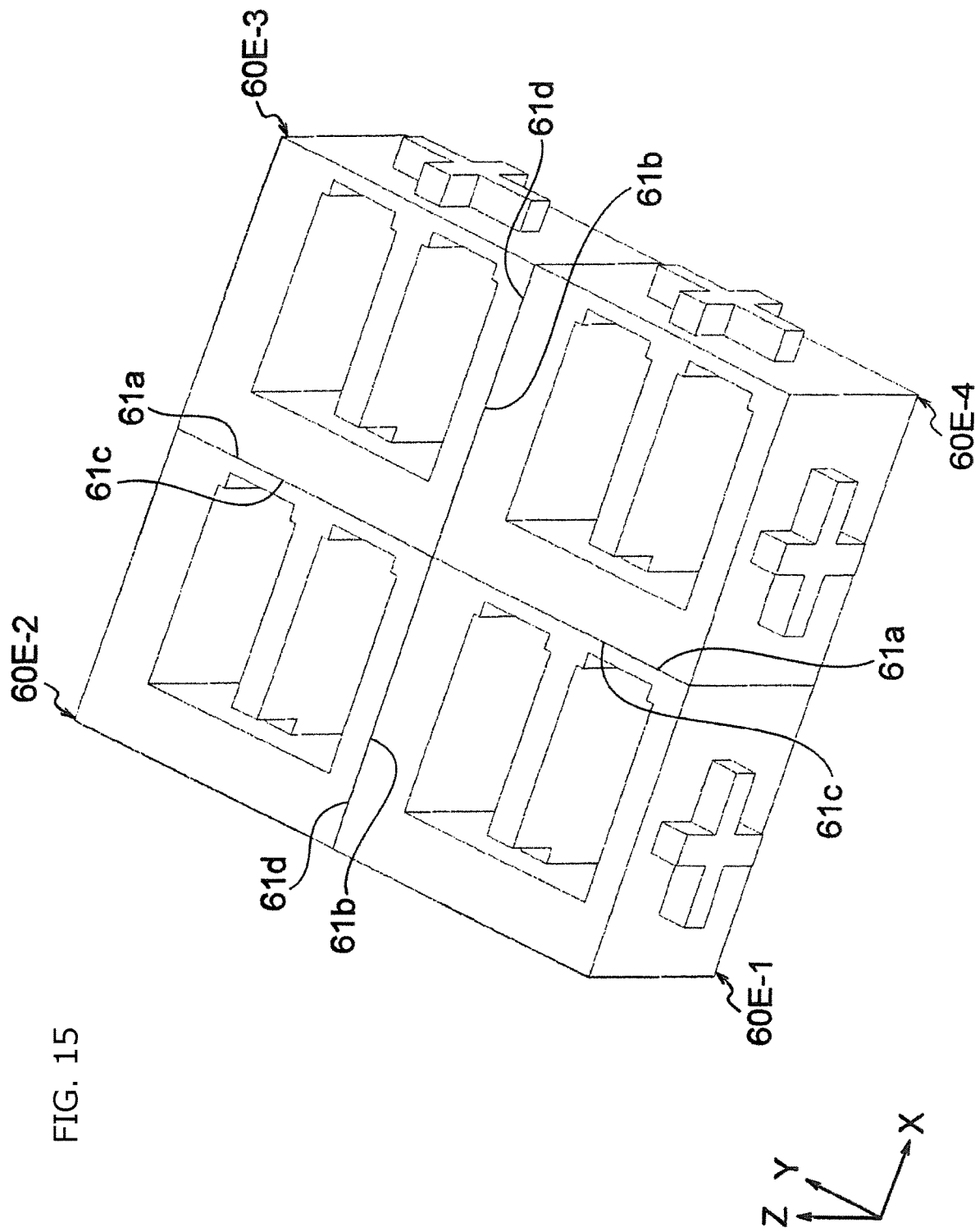
FIG. 15 is a schematic perspective view illustrating a state where four units of the case illustrated in FIG. 14A are interconnected.

An electronic device 10E according to the embodiment that is illustrated in FIGS. 14A to 15 is similar in configuration, action, and effect to the electronic device 10C according to the fourth embodiment except for the following points. In FIGS. 14A to 15, members common to the electronic device 10C of the fourth embodiment and the electronic device 10E according to the embodiment illustrated in FIGS. 14A to 15 are denoted by common reference numerals. Description of the common members will be partially omitted below. Regarding the electronic device 10E, an insulation case 60E is illustrated without the capacitor chips 20a and 20b and various metal terminals being illustrated.

As illustrated in FIGS. 14A and 14B, the insulation case 60E has an outer wall 61E. The outer wall 61E is provided with a connecting portion 100E. The connecting portion 100E is either a first engagement portion 110E or a second engagement portion 120E that can be engaged with the first engagement portion 110E. In other words, in the present embodiment, each of the first engagement portion 110E and the second engagement portion 120E plays a role as the connecting portion 100E.

The first engagement portion 110E is formed on each of the outside surfaces 61a and 61b (FIG. 14A) and the second engagement portion 120E is formed on each of the outside surfaces 61c and 61d (FIG. 14B).

A first projection 114E protruding toward the outside of the insulation case 60E forms the first engagement portion 110E. In the present embodiment, the first projection 114E is formed on each of the outside surfaces 61a and 61b and the two first projections 114E and 114E are respectively formed in substantially central portions of the outside surfaces 61a and 61b.

A second recess 124E recessed toward the inside of the insulation case 60E (in the thickness direction of the outer wall 61E) forms the second engagement portion 120E. In the present embodiment, the second recess 124E is formed in each of the outside surfaces 61c and 61d and the two second recesses 124E and 124E are respectively formed in substantially central portions of the outside surfaces 61c and 61d.

Each of the first projection 114E and the second recess 124E has a cross shape. The shape of each of the first projection 114E and the second recess 124E is not limited thereto. The shape may be, for example, a star shape, a triangular shape, a rhombic shape, a character shape such as a T shape, or another shape.

As illustrated in FIGS. 14A, 14B, and 15, the outside surface 61a of the insulation case 60E_1 (60E_2) and the outside surface 61c of the insulation case 60E_4 (60E_3) are disposed so as to face each other in the X-axis direction. The first projection 114E formed on the outside surface 61a is fitted into the second recess 124E formed in the outside surface 61c.

In addition, the outside surface 61d of the insulation case 60E_1 (60E_4) and the outside surface 61b of the insulation case 60E_2 (60E_3) are disposed so as to face each other in the Y-axis direction. The first projection 114E formed on the outside surface 61b is fitted into the second recess 124E formed in the outside surface 61d.

As described above, in the present embodiment, the first projection 114E is fitted into the second recess 124E. The first engagement portion 110E and the second engagement portion 120E are engaged with each other as a result, and thus the insulation cases 60E_1 to 60E_4, which have the same configuration, can be interconnected.

In addition, in the present embodiment, each of the first projection 114E and the second recess 124E has a cross shape. Accordingly, the engagement between the first engagement portion 110E and the second engagement portion 120E in each of the insulation cases 60E_1 to 60E_4 is unlikely to be released even when an external force along the height or width direction is applied to the insulation case 60E.

In addition, in the present embodiment, the thickness of the outer wall 61E of each of the insulation cases 60E_1 to 60E_4 can be relatively large, and thus high strength can be given to each of the insulation cases 60E_1 to 60E_4.

In addition, in the present embodiment, it is possible to engage the first engagement portion 110E and the second engagement portion 120E with each other simply by pushing the first projection 114E toward the second recess 124E and another insulation case 60E can be additionally connected with ease after the engagement.

Seventh Embodiment

Figure 16A:
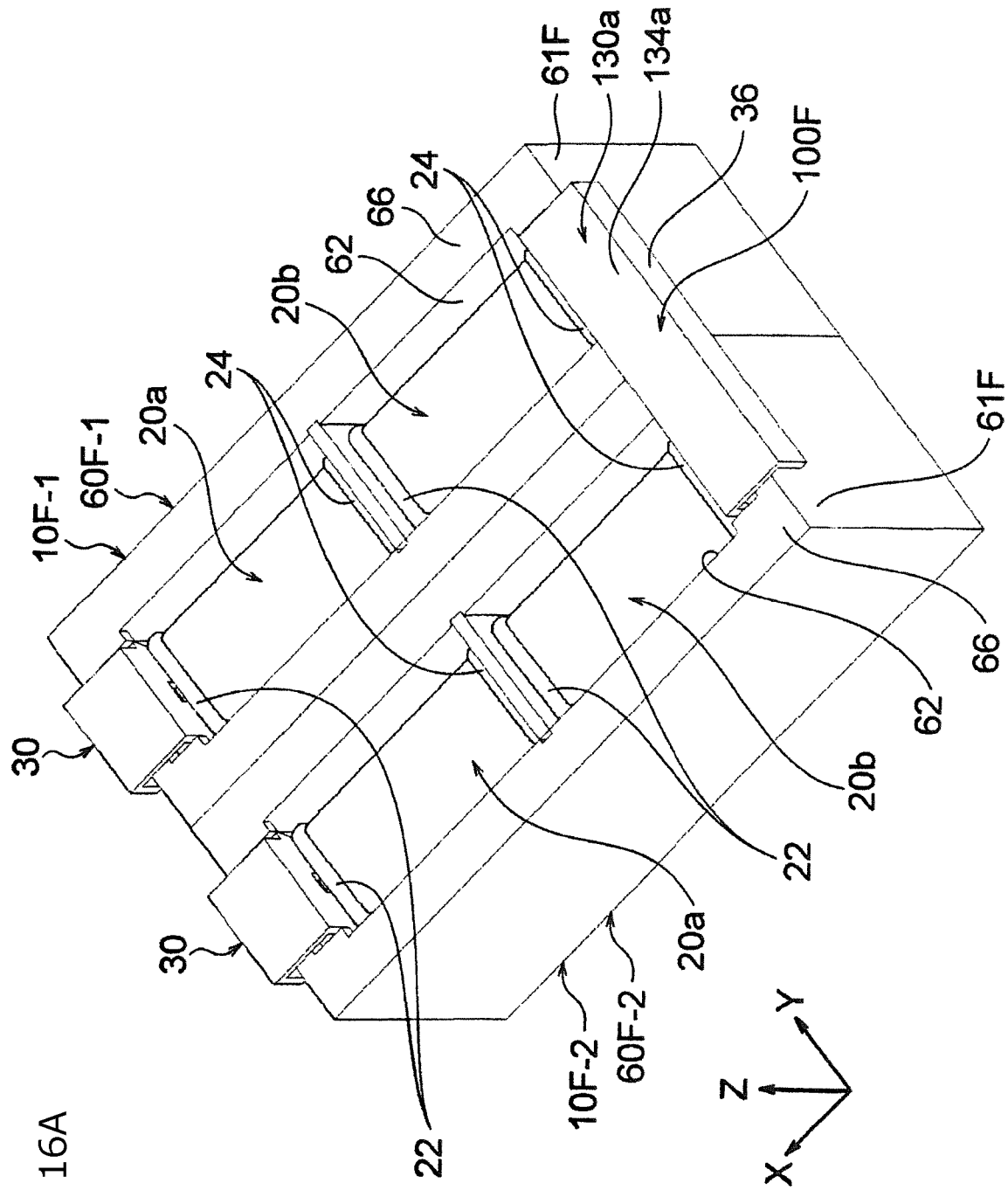
FIG. 16A is a schematic perspective view illustrating an electronic device according to a seventh embodiment of the invention.

Each of electronic devices 10F_1 and 10F_2 according to the embodiment that is illustrated in FIGS. 16A to 17 is similar in configuration, action, and effect to the electronic device 10 according to the first embodiment except for the following points. In FIGS. 16A to 17, members common to the electronic device 10 of the first embodiment and the electronic devices 10F_1 and 10F_2 according to the embodiment illustrated in FIGS. 16A to 17 are denoted by common reference numerals. Description of the common members will be partially omitted below.

As illustrated in FIG. 16A, the electronic devices 10F_1 and 10F_2 have insulation cases 60F_1 and 60F_2, respectively. The insulation cases 60F_1 and 60F_2 have the same configuration and each of the insulation cases 60F_1 and 60F_2 has an outer wall 61F. The outer wall 61F differs from the outer wall 61 of the first embodiment in that the first engagement portion 110 and the second engagement portion 120 are not formed on the outside surface of the outer wall 61F.

The insulation cases 60F_1 and 60F_2 are disposed adjacent to each other. The first connecting metal terminal 130a illustrated in FIG. 17 is attached across the insulation cases 60F_1 and 60F_2. In the insulation case 60F_1, one of the pair of inside electrode portions 32 and 32 of the first connecting metal terminal 130a is inserted into the inner wall surface on one side of the accommodation recess 62 in the X-axis direction and is connected to the second terminal electrode 24 of the capacitor chip 20b.

In the insulation case 60F_2, the other inside electrode portion 32 is inserted into the inner wall surface on one side of the accommodation recess 62 in the X-axis direction and is connected to the second terminal electrode 24 of the capacitor chip 20b.

The connection portion 134a illustrated in FIG. 17 is disposed across the respective opening edge surface 66 of the insulation cases 60F_1 and 60F_2. The side surface electrode portion 36 is disposed across the outside surfaces of the respective outer walls 61F of the insulation cases 60F_1 and 60F_2. As a result, the insulation case 60F_1 and the insulation case 60F_2 are interconnected (connected to each other) via the first connecting metal terminal 130a.

In the present embodiment, the first connecting metal terminal 130a interconnects the second terminal electrodes 24 and 24 of the capacitor chips 20b and 20a accommodated in the accommodation recesses 62 and 62 of the two different insulation cases 60F_1 and 60F_2 and interconnects the insulation cases 60F_1 and 60F_2. In other words, in the present embodiment, the first connecting metal terminal 130a plays a role as a connecting portion 100F.

Figure 16B:
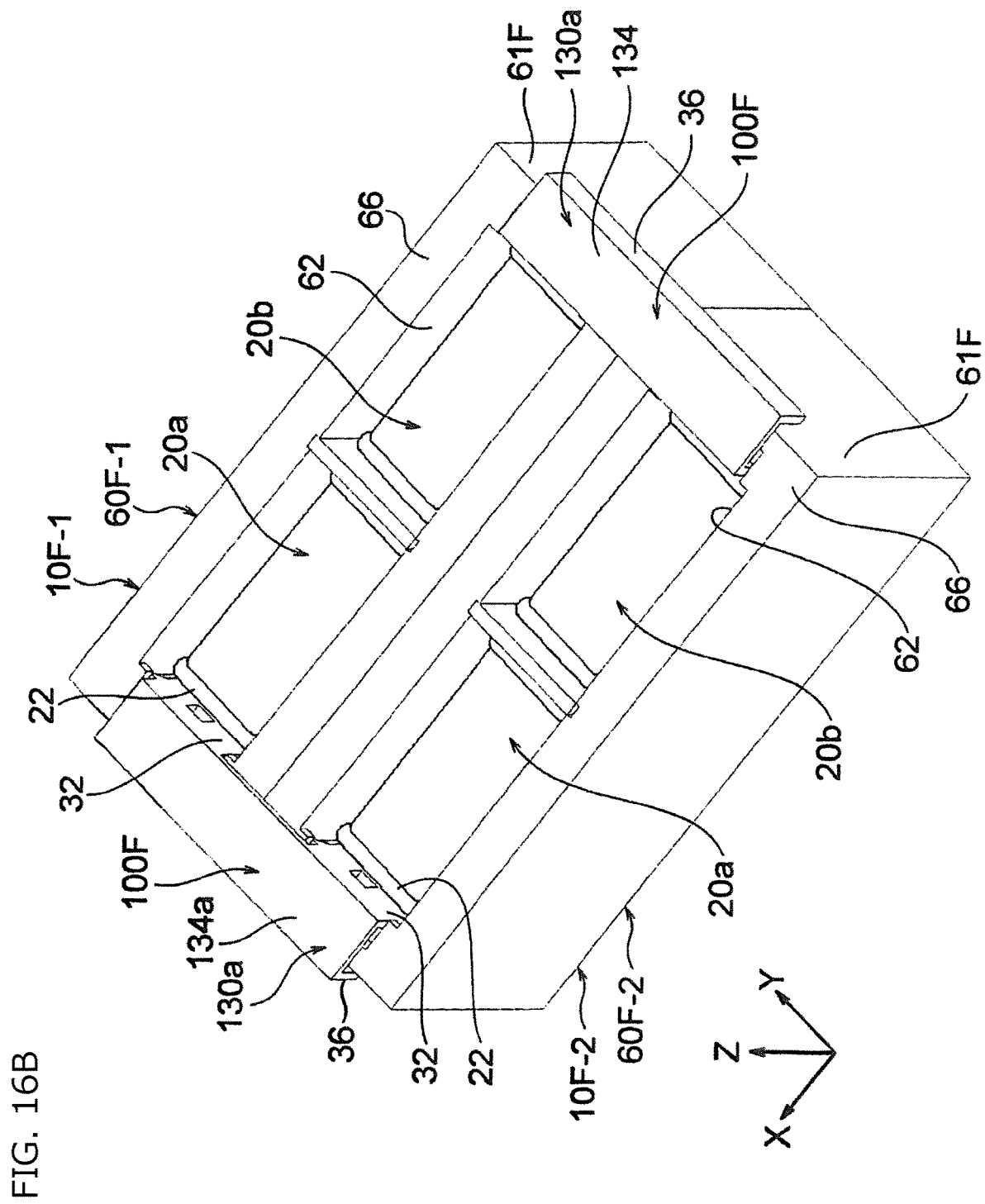
FIG. 16B is a schematic perspective view illustrating a modification example of the electronic device illustrated in FIG. 16A.

The first connecting metal terminal 130a may be attached on the other as well as one side of each of the insulation cases 60F_1 and 60F_2 in the X-axis direction as illustrated in FIG. 16B. In this case, one of the pair of inside electrode portions 32 and 32 of the first connecting metal terminal 130a is connected to the first terminal electrode 22 of the capacitor chip 20a accommodated in the accommodation recess 62 of the insulation case 60F_1. The other inside electrode portion 32 is connected to the first terminal electrode 22 of the capacitor chip 20a accommodated in the accommodation recess 62 of the insulation case 60F_2.

In the present embodiment, the connecting portion 100F is formed separately from each of the insulation cases 60F_1 and 60F_2 and is not formed on the outside surface of the outer wall 61F of each of the insulation cases 60F_1 and 60F_2. Accordingly, the configuration of the insulation cases 60F_1 and 60F_2 can be simplified.

In addition, in the present embodiment, the connecting portion 100F also serves as the first connecting metal terminal 130a. Accordingly, it is possible to interconnect the insulation case 60F_1 and the insulation case 60F_2 via the connecting portion 100F and the capacitor chips 20a and 20b accommodated in the insulation cases 60F_1 and 60F_2 can be easily connected in series or in parallel. In FIG. 16A, four capacitor chips 20a and 20b are connected in series. In FIG. 16B, two capacitor chips 20a and 20b are connected in series with two capacitor chips 20a and 20b connected in parallel.

In addition, in the present embodiment, the connecting portion 100F has the connection portion 134a interconnecting the pair of inside electrode portions 32 and 32. Accordingly, the capacitor chips 20a and 20a (20b and 20b) can be electrically interconnected via the respective inside electrode portions 32 and 32 and the connection portion 134a.

The invention is not limited to the embodiments described above and can be variously modified within the scope of the invention.

For example, a chip component other than the capacitor chip may be used although the capacitor chip has been described as an example of a chip component in each of the embodiments described above.

In addition, the number of the capacitor chips of the electronic device 10 is not limited to two and may be one or three or more in each of the embodiments described above.

In each of the embodiments described above, the partition wall 64 constitutes a part of the insulation case 60. Alternatively, a separate partition wall member (member similar in function to the partition wall 64) may be prepared and provided at a position corresponding to the partition wall 64 of the insulation case 60. In other words, an insulating partition wall may be formed separately from the insulation case.

In the first embodiment, the individual circuit patterns 72 and 72 of the circuit board (external circuit) 70 and the side surface electrode portions 36 and 36 of the electronic device 10 can be interconnected by the solder 80 or the like. Alternatively, the interconnection may be performed by means of a connection member other than the solder 80. Examples of the connection member other than the solder 80 include a conductive adhesive and an anisotropic conductive tape.

In the first embodiment, the first engagement portion 110 and the second engagement portion 120 extend in the Y-axis direction and are bent in the X-axis direction. Alternatively, the first engagement portion 110 and the second engagement portion 120 may extend in the Y-axis direction and be bent in the Z-axis direction.

In the second embodiment, the common metal terminal 40 may be constituted only by the inside electrode portion 42 inserted into the accommodation recesses 62Aa and 62Ab through the communication groove 65. In this case, a rectangular flat plate may constitute the inside electrode portion 42. The same applies to the third embodiment.

In the second and third embodiments, the circuit pattern to which various metal terminals are connected may be a floating pattern that is not connected to another circuit pattern.

The various metal terminals may be appropriately changed in type in the second and third embodiments. For example, the two second connecting metal terminals 130b may be used in place of the third connecting metal terminal 130c in FIG. 6A.

In this case, the second terminal electrode 24 of the capacitor chip 20b accommodated in the accommodation recess 62Ab of the insulation case 60A_2 and the first terminal electrode 22 of the capacitor chip 20b accommodated in the accommodation recess 62Ab of the insulation case 60A_3 are interconnected via one of the second connecting metal terminals 130b.

In addition, the second terminal electrode 24 of the capacitor chip 20a accommodated in the accommodation recess 62Aa of the insulation case 60A_1 and the first terminal electrode 22 of the capacitor chip 20a accommodated in the accommodation recess 62Aa of the insulation case 60A_4 are interconnected via the other second connecting metal terminal 130b.

As a result, each of the eight capacitor chips 20a and 20b of the electronic devices 10A_1 to 10A_4 can be connected in series. Accordingly, the withstand voltage of the electronic devices 10A_1 to 10A_4 can be increased and a contribution can be made to the safety of an electronic device where the electronic devices 10A_1 to 10A_4 are mounted.

It is possible to realize various connections in the second embodiment by appropriately changing the various metal terminals in type as described above. Examples of the connections include eight-series connection, two-series four-parallel connection, a combination of two-series two-parallel connection and two two-series connections, and a combination of two-series three-parallel connection and two-series connection. In addition, it is possible to realize various connections in the third embodiment. Examples of the connections include six-series connection, a combination of two three-series connections, and a combination of two-series two-parallel connection and two capacitor chip units.

In the second embodiment, the configuration of the connecting metal terminals 130a to 130c is not limited to the configuration illustrated in FIG. 6C. For example, the two inside electrode portions 32 and 32 may be further connected to the connection portion 134a of the first connecting metal terminal 130a. Then, the second terminal electrodes 24 of the four capacitor chips 20a and 20b of the electronic devices 10A_3 and 10A_4 illustrated in FIG. 6A can be connected to each other via the four inside electrode portions 32 and the connection portion 134a.

In the second embodiment, the insulation cases 60A_1 to 60A_4 may be interconnected by means of the first connecting metal terminal 130a, the second connecting metal terminal 130b, and the third connecting metal terminal 130c with the first engagement portion 110A and the second engagement portion 120A omitted. The same applies to the third embodiment.

In the second embodiment, the numbers of the first projections 113 and the second projections 123_1 to 123_5 are not particularly limited. The numbers may be larger or smaller than the numbers illustrated in FIGS. 7A and 7B. The same applies to the third embodiment.

In the seventh embodiment, the first connecting metal terminal 130a has a function as a metal terminal electrically interconnecting the second terminal electrodes 24 of the capacitor chips 20b respectively accommodated in the insulation cases 60F_1 and 60F_2 and a function as connecting means for interconnecting the insulation cases 60F_1 and 60F_2. Alternatively, the former function may be omitted. In other words, only the mechanical connection between the insulation cases 60F_1 and 60F_2 may be performed by the first connecting metal terminal 130a with a separately prepared metal terminal used.

What is claimed is:

1. An electronic device comprising:
   a chip component having terminal electrodes formed on both end surfaces;
   a pair of conductive terminals connected to the terminal electrodes, respectively;
   a case accommodating the chip component; and
   a connecting portion interconnecting the case to another case, wherein at least one of the conductive terminals comprises:
   an inside electrode portion inserted and arranged on an X-axis inside wall of an accommodation recess accommodating the chip component, the X-axis inside wall being positioned on an end of the accommodation recess along an X-axis,
   an opening edge electrode portion connected to the inside electrode portion and formed across an opening edge surface of the accommodation recess, the opening edge surface being positioned at an end of the accommodation recess along a Z-axis perpendicular to the X-axis,
   a Y-axis inside wall positioned on one end of the accommodation recess along a Y-axis faces one side surface of the chip component along the Y-axis, and
   another Y-axis inside wall positioned on another end of the accommodation recess along the Y-axis faces another side surface of the chip component along the Y-axis.

2. The electronic device according to claim 1, wherein the connecting portion comprises a first engagement portion or a second engagement portion engageable with the first engagement portion of the other case, and
   the first engagement portion and the second engagement portion are formed on outer side surface of the case.

3. The electronic device according to claim 2, wherein the first engagement portion and the second engagement portion have hook shapes allowing mutual engagement.

4. The electronic device according to claim 3, wherein
   a pair of first engagement portions are formed on the outer side surface on one side of the case,
   a pair of second engagement portions are formed on the outer side surface on the other side of the case,
   the pair of first engagement portions are bent toward each other, and
   the pair of second engagement portions are bent away from each other.

5. The electronic device according to claim 2, wherein
   the first engagement portion comprises a projection protruding outward from the case, and
   the second engagement portion comprises a recess recessed toward an inner side of the case.

6. The electronic device according to claim 5, wherein each of the projection and the recess has a trapezoidal cross-sectional shape.

7. The electronic device according to claim 6, wherein
the projection becomes wide along a height direction of the case in a protrusion direction of the projection, and
the recess becomes wide along the height direction of the case in a same direction as the protrusion direction.

8. The electronic device according to claim 6, wherein the recess extends substantially horizontally along the outer side surface of the case from a corner portion of the case.

9. The electronic device according to claim 7, wherein the recess extends substantially horizontally along the outer side surface of the case from a corner portion of the case.

10. The electronic device according to claim 6, wherein
the projection becomes wide along a width direction perpendicular to a height direction of the case in a protrusion direction of the projection, and
the recess becomes wide along the width direction of the case in a same direction as the protrusion direction.

11. The electronic device according to claim 6, wherein the recess extends substantially vertically along the outer side surface of the case from a corner portion of the case.

12. The electronic device according to claim 10, wherein the recess extends substantially vertically along the outer side surface of the case from a corner portion of the case.

13. The electronic device according to claim 5, wherein each of the projection and the recess has a cross shape.

14. The electronic device according to claim 2, wherein
a first projection protruding outward from the case forms the first engagement portion,
an assemblage of a second projections protruding outward from the case forms the second engagement portion, and
the first projection is sandwiched by the assemblage of the discretely disposed second projections of the other case.

15. The electronic device according to claim 1, wherein the connecting portion is formed separately from the case.

16. The electronic device according to claim 15, wherein the connecting portion also serves as the conductive terminal and interconnects the terminal electrode of the chip component accommodated in the case with a terminal electrode of another chip component accommodated in the other case.

17. The electronic device according to claim 16, wherein the connecting portion has inside electrode portions connected to the terminal electrode of the chip component accommodated in the case and an electrode connection portion interconnecting the inside electrode portions.

18. The electronic device according to claim 1, wherein
the connecting portion is formed on an outer wall surface of the case,
the Y-axis is perpendicular to the X-axis and the Z-axis, and
the outer wall is perpendicular to the Y-axis.

19. The electronic device according to claim 18, wherein
the connecting portion is formed on the wall surface of the case, and
the outer wall is perpendicular to the X-axis.

20. An electronic device comprising:
a chip component having terminal electrodes formed on both end surfaces;
a pair of conductive terminals connected to the terminal electrodes, respectively;
a case accommodating the chip component; and
a connecting portion interconnecting the case to another case, wherein at least one of the conductive terminals comprises:
an inside electrode portion inserted and arranged on an inside wall of an accommodation recess accommodating the chip component, the inside wall being positioned on an end of the accommodation recess along an X-axis, and
an opening edge electrode portion connected to the inside electrode portion and formed across an opening edge surface of the accommodation recess, the opening edge surface being positioned at an end of the accommodation recess along a Z-axis perpendicular to the X-axis, and wherein
the accommodation recess comprises accommodation recesses, and the chip component comprises chip components contained in the accommodation recesses respectively.

21. The electronic device according to claim 20, wherein
one of the pair of conductive terminals is a common metal terminal,
the common metal terminal has a pair of inside electrode portions,
the inside electrode portions are interconnected by the opening edge electrode portion, and
the inside electrode portions are connected to the chip components, respectively.

22. The electronic device according to claim 21, wherein
the connecting portion comprises a first engagement portion or a second engagement portion engageable with the first engagement portion,
the first engagement portion is formed on an outer side surface of the case,
the second engagement portion is formed on an outer side surface the other case,
the first engagement portion comprises a convex protruding outward from the case,
the second engagement portion comprises a concave recessed toward an inner side of the case,
the recess is formed on an outer wall surface of the other case,
the outer wall surface of the case is perpendicular to the X-axis
the inside electrode portions of the common metal electrode are arranged on an inside wall of the case, and
the inside wall is opposite to the outer wall surface having the concave of the other case in the X-axis.

23. The electronic device according to claim 1, wherein the opening edge electrode portion extends outward in the X-axis direction from one end of the inside electrode portion in the Z-axis direction.

* * * * *